(12) United States Patent
Chow et al.

(10) Patent No.: US 8,367,435 B2
(45) Date of Patent: Feb. 5, 2013

(54) METHODS AND APPARATUS FOR CONTROL OF HYDROTHERMAL NANOWIRE SYNTHESIS

(75) Inventors: Brian Yichiun Chow, Cambridge, MA (US); Jaebum Joo, Medford, MA (US); Manu Prakash, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 244 days.

(21) Appl. No.: 12/960,182

(22) Filed: Dec. 3, 2010

(65) Prior Publication Data

US 2011/0143464 A1 Jun. 16, 2011

Related U.S. Application Data

(60) Provisional application No. 61/266,498, filed on Dec. 3, 2009.

(51) Int. Cl.
*H01L 21/00* (2006.01)
(52) U.S. Cl. .......... 438/22; 977/700; 977/762; 977/765; 977/773
(58) Field of Classification Search .............. 438/22, 438/99; 977/700, 762, 765, 773
See application file for complete search history.

(56) References Cited

U.S. PATENT DOCUMENTS

2012/0183435 A1* 7/2012 Whitcomb et al. .......... 420/501

OTHER PUBLICATIONS

Face-selective electrostatic control of hydrothermal zinc oxide nanowire synthesis Jaebum et al. Nature Materials, vol. 10, pp. 596-601, Aug. 2011.*
Synthesis and photoluminescence of ultra-thin ZnO nanowire/nanotube arrays formed by hydrothermal growth Ye Sun et al. Chemical Physics Letters, 431 (2006) 352-357, Oct. 2006.*
Hydrothermal synthesis and photoluminescence properties of ZnO nanowires Jinmin et al. Solid State Communications, 132 (2004) 269-271, Aug. 2004.*

* cited by examiner

*Primary Examiner* — Jarrett Stark
*Assistant Examiner* — John M Parker
(74) *Attorney, Agent, or Firm* — Stephen R. Otis

(57) ABSTRACT

In exemplary implementations of this invention, hydrothermal synthesis of zinc oxide nanowires is morphologically controlled. Metal complex ions are used to suppress growth in a face-selective manner, by electrostatic crystal growth inhibition. This permits the aspect ratio (height/diameter) of the nanowires to be dynamically tuned over a wide range, from needle-like nanowires that are efficient field emitters to flattened nanowires with a platelet-like shape. The nanowire synthesis is all inorganic and occurs at low temperatures (e.g., $<=60°$ C.). The growth inhibition may be predictively modeled, using speciation plots and treating non-zinc complex ions as ligands. Microfluidic channels may be used for the synthesis, with different solutions flowing down different channels, permitting nanowires with different properties to be synthesized in parallel. This invention may be used to produce field emission devices and nanowire-embedded AC electroluminescent devices, and for in-situ fabrication of spatially complex integrated devices in a polymeric microfluidic system.

20 Claims, 29 Drawing Sheets

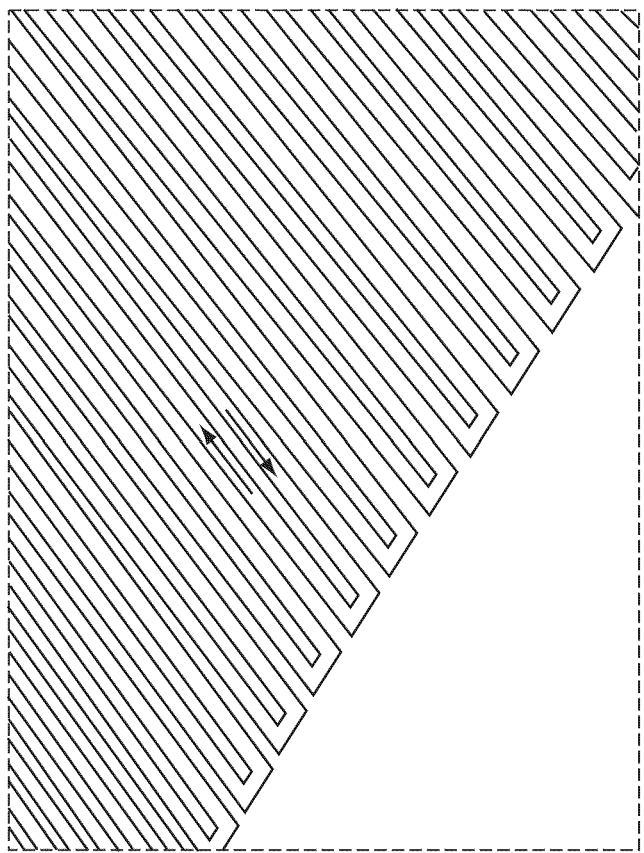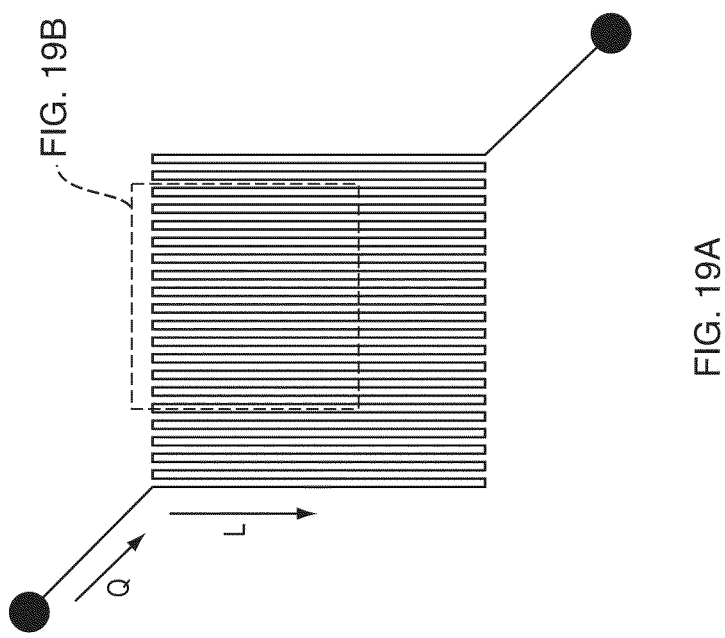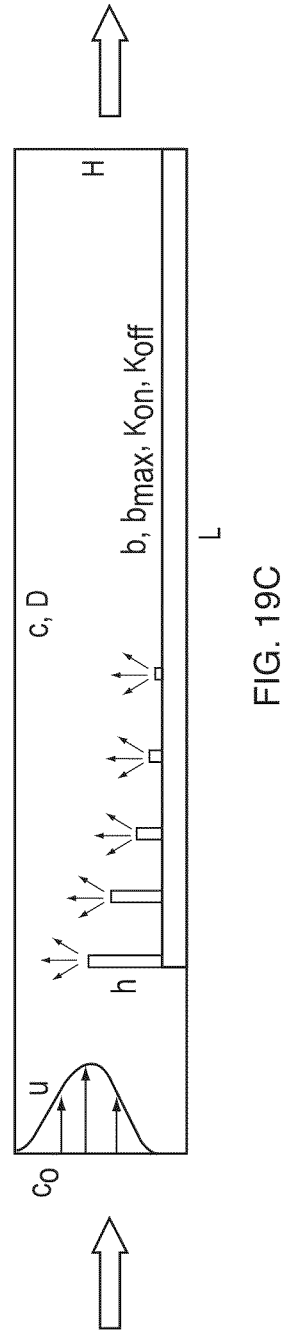
FIG. 19A
FIG. 19B
FIG. 19C

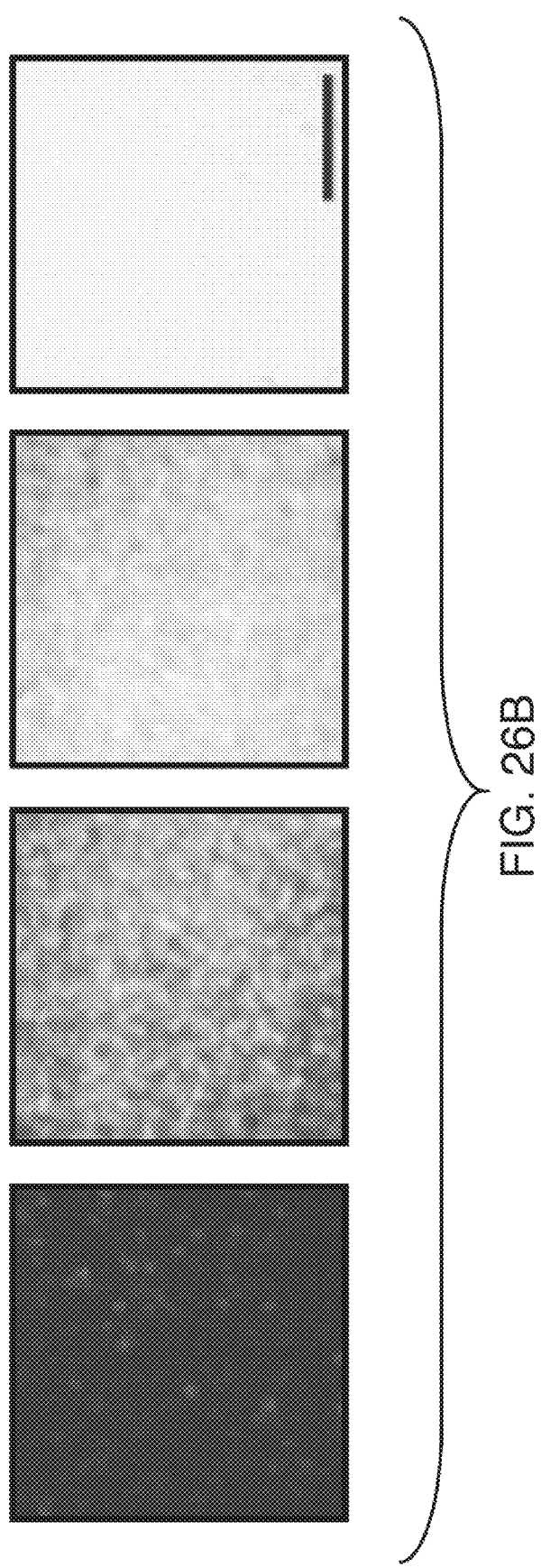

METHODS AND APPARATUS FOR CONTROL OF HYDROTHERMAL NANOWIRE SYNTHESIS

RELATED APPLICATIONS

This application claims the benefit of U.S. Provisional Application Ser. No. 61/266,498, filed Dec. 3, 2009, the entire disclosure of which is herein incorporated by reference.

STATEMENT REGARDING FEDERALLY SPONSORED RESEARCH OR DEVELOPMENT

This invention was made with U.S. government support under grant number CCR0122419, awarded by the National Science Foundation. The government has certain rights in this invention.

FIELD OF THE TECHNOLOGY

The present invention relates generally to nanostructures.

COMPUTER PROGRAM LISTING

The ASCII text file named morphology_control.txt, created Nov. 19, 2010, with a size of 19,136 bytes (the "Source Code"), comprises a computer program listing for an exemplary implementation of this invention. That ASCII text file is incorporated by reference herein.

SUMMARY

In exemplary implementations of this invention, hydrothermal synthesis of zinc oxide nanowires is morphologically controlled. Metal complex ions are used to suppress growth in a face-selective manner, by electrostatic crystal growth inhibition.

By adding non-zinc metal cations to the aqueous solution, the aspect ratios (height/diameter) of the resulting nanowires may be dramatically altered over a >1000 range. For example, by adding aluminum, indium or gallium cations, the aspect ratio may be increased, resulting in tall, needle-like nanowires. In contrast, by adding cadmium, copper, magnesium or calcium cations to the aqueous solution, the aspect ratio may be decreased, resulting in short, wide nanoplatelets.

This morphology control occurs because charged complex ions in the aqueous solution are electrostatically attracted to the ZnO crystal in a face-selective manner. For example, in a prototype of this invention, at pH 11, the surface charges for top (0002) and side (10$\bar{1}$0) planes of the zinc oxide crystals are negative and positive, respectively. The non-zinc cations form charged but unreactive complexes that tend to localize to the oppositely charged crystal faces, thereby competitively limiting the access of the reactive zinc intermediates and inhibiting growth in a face-specific manner. For example, in this prototype, if Al, In, or Ga cations are added to the aqueous solution at pH=11, they form predominantly negatively charged complexes that are electrostatically attracted to a positively charged side (10$\bar{1}$0) plane. These tend to compete with zinc complex ions for access to that side plane, suppressing growth at that plane. This causes a higher aspect ratio. In contrast, if Cd, Cu, Mg, or Ca cations are added to the aqueous solution at pH=11, they form predominantly positively charged complexes that are electrostatically attracted to the negatively charged top (0002) plane. These tend to compete with zinc complex ions for access to that top plane, inhibiting growth at that plane. This results in a lower aspect ratio.

In these exemplary implementations, the synthesis is all inorganic.

Advantageously, the synthesis occurs at low temperatures (e.g., <=60° C.) that are more favorable to device integration and in-situ fabrication.

Advantageously, the additional non-zinc complex ions are not incorporated into the crystal, but are merely attracted (adsorbed) to particular faces of the crystal. In a prototype of this invention, no evidence of material exchange or doping was observed. The lack of incorporation during the low temperature aqueous synthesis differs from the ion exchange or doping that occurs at high temperature in organic solvents or co-introduction of gases in vapor-liquid solid (VLS) synthesis. Although the process resembles in some respects surfactant-mediated morphological control during thermolysis reactions, a difference here is the fact that the morphology tuning is dominated by electrostatics. The ability to controllably alter aspect ratio over >1000-fold range by introducing inorganic complexes is highly desirable.

Advantageously, this invention permits dynamic tuning of nanowire aspect ratio.

In exemplary implementations of this invention, face-selective electrostatic growth inhibition may be predictively modeled. In this modeling, speciation plots are made of the zinc complex ion distributions and non-zinc complex ion distributions, based on thermodynamic constants and pH-dependent surface charge. In a simplified scenario (e.g. where the relative concentration of non-zinc ions is =<20%), the plots can usually be made separately because the ions have minimal effect on the zinc complex-ion distribution. In this modeling, non-zinc complex ions are treated as ligands that inhibit growth by limiting access of reactive zinc intermediates via face selective crystal growth inhibition. A high concentration on non-zinc complex ions of a specific charge will inhibit growth at the crystal face of opposite charge.

This invention may be implemented by using microfluidic channels for the nanowire synthesis. In such an approach, different solutions may flow down different channels, permitting nanowires with different properties to be synthesized in parallel. For example, by varying the identity and concentration of additional non-zinc cations, the aspect ratio of nanowires grown in different microfluidic channels may be varied. Advantageously, this microfluidic approach may also be used to achieve a growth rate that is greater than in bulk solution synthesis under the same conditions by minimizing the depletion of reactant ions using continuous flow.

This invention has many practical applications.

For example, by increasing the aspect ratio of nanowires, the tips of the nanowires may be sufficiently sharpened to create efficient field emitters. In a prototype of this invention, field emitters were created by morphological control of hydrothermal nanowire synthesis.

In another prototype, this invention was used to manufacture a nanowire embedded AC electroluminescent (ACEL) device. Morphology control was used to vary the aspect ratio of the embedded nanowires. An ACEL device with higher aspect ratio nanowires exhibited lower turn on voltage and higher lumen/watt, because of the higher field induced at the tip of the nanowire.

The benign synthesis conditions (e.g., 45-60° C.) that are allowed by this invention may be used to advantage for in-situ fabrication in a polymeric microfluidic system. As a demonstration of this capability, this invention has been used for microfluidic in-situ fabrication of a nanowire-based MIS-LED (metal-insulator-semiconductor LED) all in one polymeric device.

The above description of the present invention is just a summary. It is intended only to give a general introduction to some illustrative implementations of this invention. This invention may be implemented in many other ways.

BRIEF DESCRIPTION OF THE DRAWINGS

FIGS. 19A and 19B are diagrams of a serpentine microfluidic channel, in a prototype of this invention.

FIG. 19C is a diagram that shows how nanowire geometry may vary within a single microfluidic channel, in exemplary implementations of this invention.

FIG. 26B comprises photographs of electroluminescent light emission from nanowire embedded ACELs, in a prototype of this invention.

The above Figures illustrate some illustrative implementations of this invention, or provide information that relates to those implementations. However, this invention may be implemented in many other ways.

DETAILED DESCRIPTION

In exemplary implementations of this invention, hydrothermal synthesis of zinc oxide nanowires is morphologically controlled. Metal complex ions are used to suppress growth in a face-selective manner, by electrostatic crystal growth inhibition.

In some implementations of this invention, single-crystalline nanowires are grown on substrates with zinc oxide seed layers, in aqueous solutions of 10 mM zinc sulfate and 0.3M ammonium chloride to improve zinc ion solubility (pH=11, 60° C.). Ancillary non-zinc sulfates are added into this reaction, thereby controlling the local reaction environment during the growth phase. The non-zinc ions form charged but unreactive complexes that tend to localize to the oppositely charged crystal surfaces, thereby competitively limiting the access of the reactive zinc intermediates and inhibiting growth in a crystal face-specific manner. The surface charges for the (0002) and (10$\bar{1}$0) planes of the zinc oxide crystals are negative and positive, respectively, at pH=11.

In these implementations, Al, In, or Ga cations may be added to the aqueous solution at pH=11, forming predominantly negatively charged complex ions that are electrostatically attracted to the positively charged side (10$\bar{1}$0) plane of the zinc oxide crystal, thereby competitively inhibiting the access of the reactive zinc intermediaries to that side plane and inhibiting the growth of that side plane. This inhibits radial growth, leading to a higher aspect ratio than would occur with unmodified growth (zinc ions only).

Or, in these implementations, Cd, Cu, Mg, or Ca cations may be added to the aqueous solution at pH=11, forming predominantly positively charged complex ions that are electrostatically attracted to the negatively charged top (0002) plane of the zinc oxide crystal, thereby competitively inhibiting the access of the reactive zinc intermediaries to that top plane and inhibiting the growth of that top plane. This suppresses axial growth, leading to a lower aspect ratio than would occur with unmodified growth.

Figure 1:
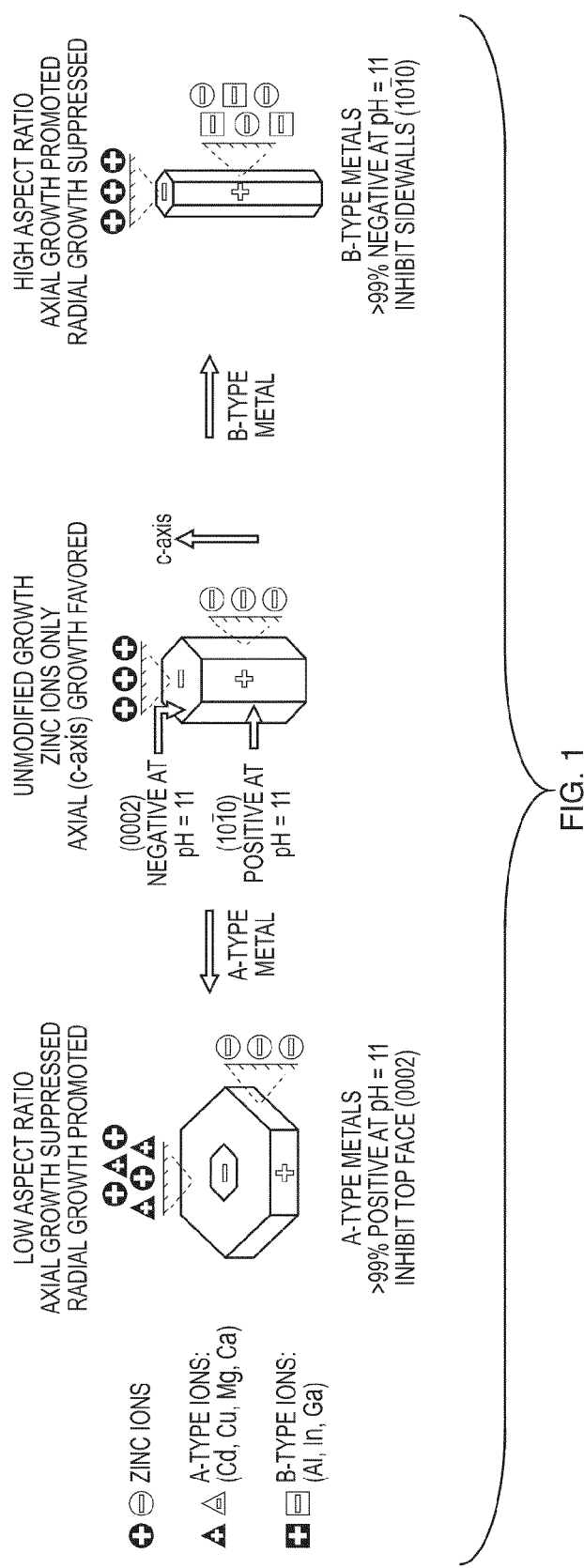
FIG. 1 is a diagram that illustrates face-selective electrostatic adsorption, in exemplary implementations of this invention.

FIG. 1 is a diagram that illustrates face-selective electrostatic adsorption, in some implementations of this invention.

In a prototype of this invention, morphologically controlled ZnO nanowires are grown as follows: Pre-cleaned Si substrate is coated with a ZnO seed layer (2~30 nm thick) by RF sputtering (150 W, 20 mTorr, 12 sccm Ar). The substrate is placed upside down in a 100 mL solution in a closed system containing fixed concentration of zinc sulfate ($ZnSO_4 \cdot 7H_2O$ 0.01M) and ammonium chloride ($NH_4Cl$ 0.3M) with additional variable concentration of metal sulfate hydrate ($Al_2(SO_4)_3 \sim 18H_2O$, $In_2(SO_4)_3 \cdot xH_2O$, $Ga_2(SO_4)_3 \cdot xH_2O$, $SrSO_4$, $CaSO_4 \cdot 2H_2O$, $MgSO_4 \cdot 7H_2O$, $CuSO_4 \cdot 5H_2O$, $CdSO_4 \sim 8/3H_2O$, 0~0.002M), followed by pH adjustment to 11 by sodium hydroxide (NaOH). This enclosed system is then heated to 60 C in a convection oven at various times for the nanowire growth.

Figure 2:
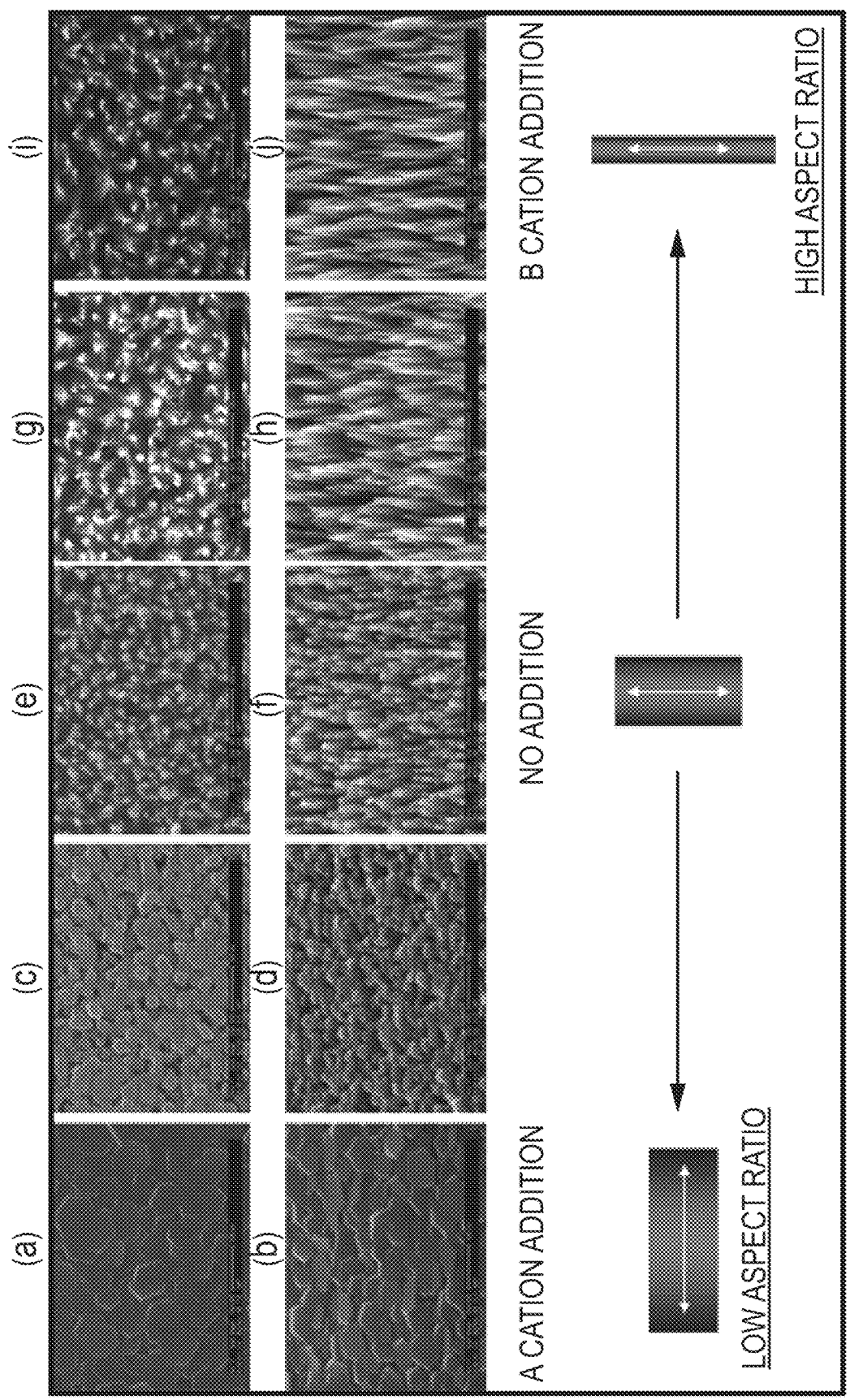
FIG. 2 comprises scanning electron microscope (SEM) images of different aspect ratios achieved by adding varying concentrations of Cd and Al ions, in a prototype of this invention.

In this prototype, by altering the identity and concentration of the ancillary metal sulfates, the aspect ratio of nanowires is controlled. FIG. 2 comprises scanning electron microscope (SEM) images of different aspect ratios achieved by adding varying concentrations of Cd and Al ions, in this prototype. In FIG. 2, the top row of SEM images (a, c, e, g, i) were taken from directly above the nanowires, and the bottom row of SEM images (b, d, f, h, j) were taken at a 45 degree angle from the axis of the nanowires. The SEM images in FIG. 2 are of nanowires grown in five different chemical solutions: in images (a, b), Cd 0.002 M was added to the solution; in images (c, d), Cd 0.001 M was added to the solution; in images (e, f) no additional cations were used; in images (g, h) Al 0.001 M was added to the solution; and in images (i, j) Al 0.002 M was added to the solution.

Figure 3:
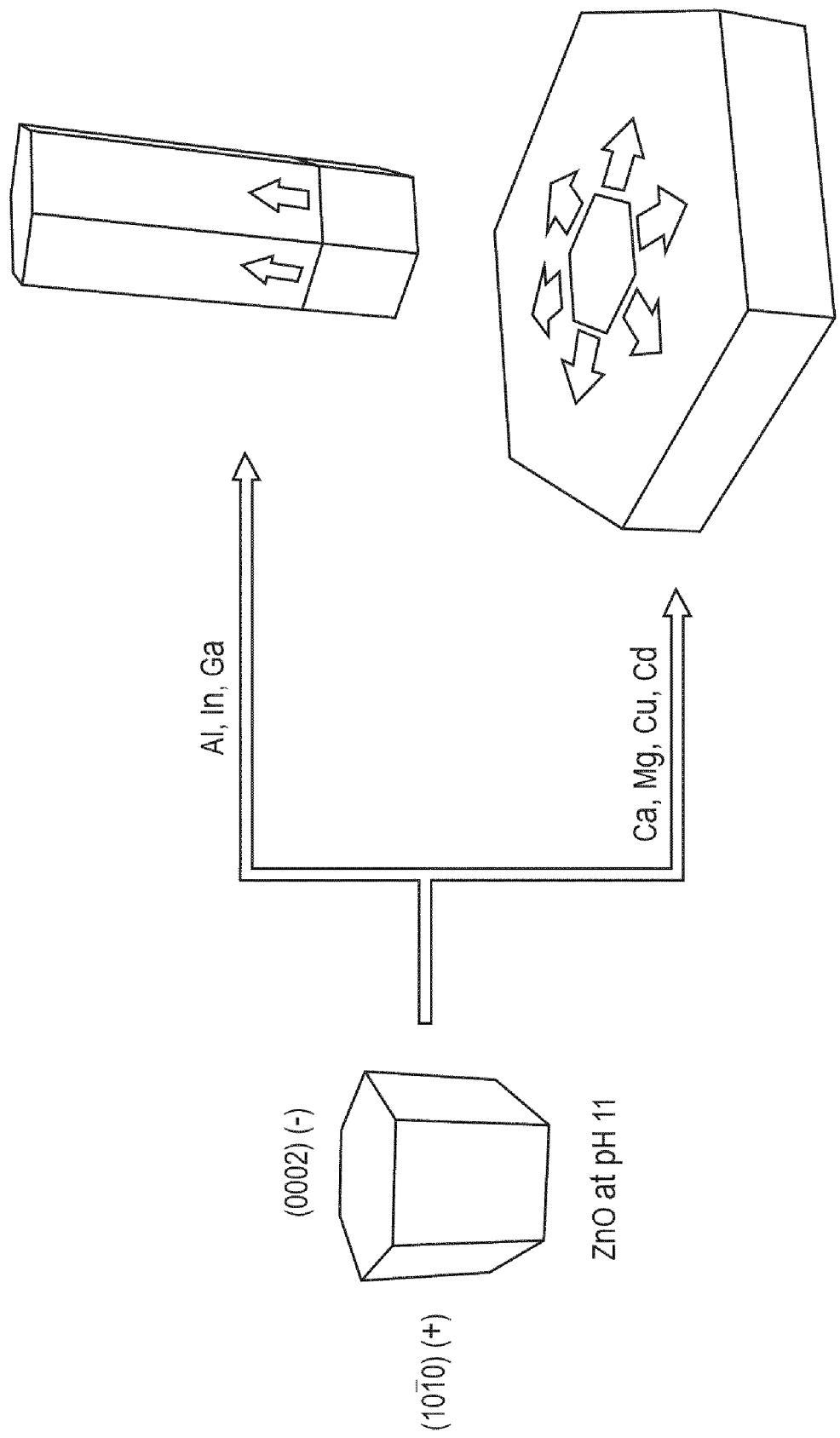
FIG. 3 illustrates how aspect control of zinc oxide nanowires may be achieved, in exemplary implementations of this invention.

FIG. 3 is a diagram that illustrates how aspect control of zinc oxide nanowires may be achieved in this prototype. At pH=11, the top (0002) plane of the zinc oxide crystal is negatively charged, and the side ($10\bar{1}0$) plane of the crystal is positively charged. By adding Al, In or Ga cations to the aqueous solution, axial growth is promoted. This occurs because these cations form predominantly negatively charged complex ions at pH=11 that are electrostatically attracted to the positive charged side ($10\bar{1}0$) plane of the crystal, competitively limiting access of the reactive zinc complexes to that side plane. In contrast, by adding Ca, Mg, Cu, or Cd cations to the aqueous solution, radial growth is promoted. This occurs because these cations form predominantly positively charged complex ions at pH=11 that are electrostatically attracted to the negatively charged top (0002) plane of the crystal, competitively limiting access of the reactive zinc complexes to that top plane.

Figure 4:
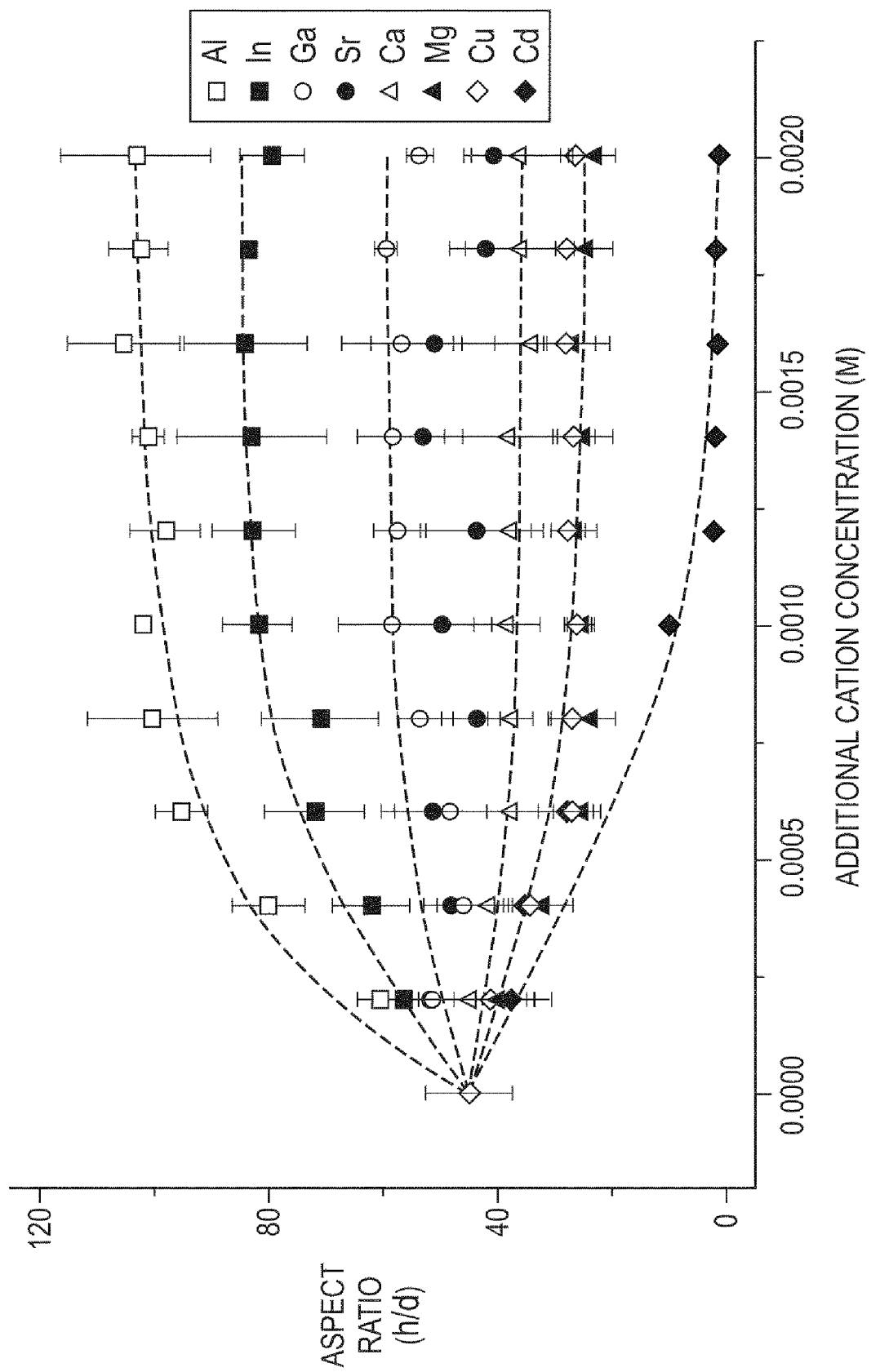
FIG. 4 shows measured aspect ratio from scanning electron microscope (SEM) cross sectional analysis with eight different cations for ten different concentrations, in a prototype of this invention.

FIG. 4 is a graph that shows measured aspect ratio with eight different cations for ten different concentrations, in this prototype. As shown in this graph, aspect ratio tends to increase with Al, In, and Ga addition, but decrease with the addition of Ca, Mg, Cu, and Cd. In the case of Sr, no distinctive trend was observed because of aspect ratio fluctuation with different concentrations.

In this prototype, both zinc hydroxide complexes and zinc amine complexes exist in the chemical solution bath for ZnO nanowire growth. When cations other than Zn are introduced in the reaction solution, they also form complexes either with hydroxide and amine. Because total hydroxide and amine concentration is fixed at any particular condition, Zn complex distribution also changes by additional cations. Those charged Zn complex ions adhere to specific crystal facet of ZnO, which is energetically favorable direction. This selective zinc complex adsorption determines the shapes of crystals.

As each surface plane of single crystal has a different surface energy, every plane has a different surface potential defined by isoelectric point (IEP) when the crystal is introduced in the solution. Since hydroxide and proton can adsorb to or desorb from the crystal plane, surface potential changes with pH. IEP is the pH where the surface potential is zero, neutral charge condition. Crystal surface forms positive charges when pH<IEP. When pH>IEP, the surface forms negative charges. Since each crystal plane has different atomic distributions, each plane has different IEP.

For ZnO, previously reported (0002) plane IEP is 8.7±0.2. At pH 11, (0002) plane forms negative surface charges. Since a (0002) plane consists of all Zn atoms and a ($10\bar{1}0$) plane consists of ½ Zn and ½ O atoms, (0002) has higher binding forces to hydroxyl groups and easily forms a negatively charged condition. Therefore, IEP is lower for the (0002) plane. In contrast, a ($10\bar{1}0$) plane of the ZnO crystal is positively charged at pH 11.

Figure 5:
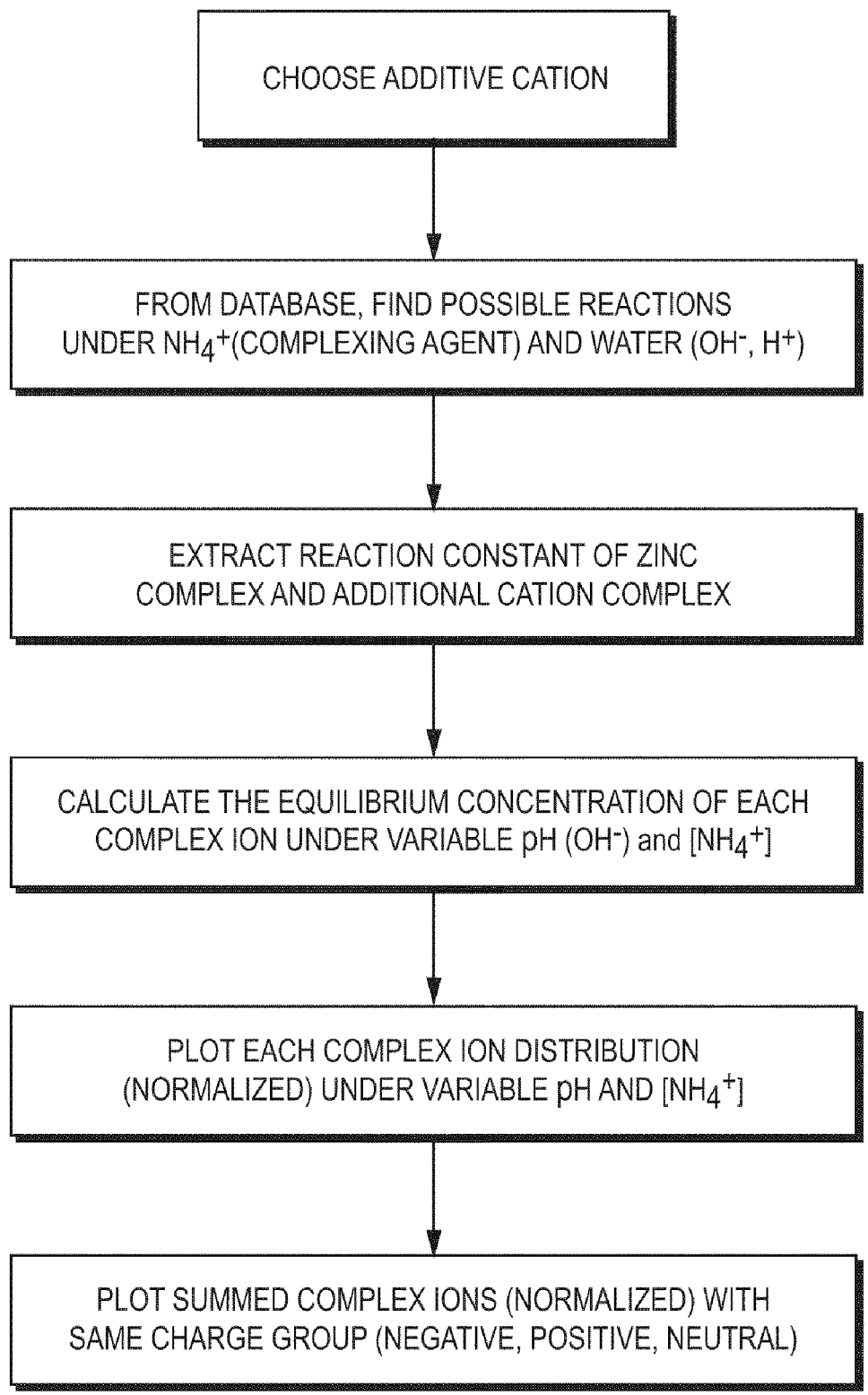
FIG. 5 is a high-level flow chart of an algorithm used for calculating speciation plots of complex ion distributions, in a prototype of this invention.

According to principles of this invention, speciation plots of complex ion distributions may be calculated. FIG. 5 is a high-level flow chart of an algorithm used for such calculations, in this prototype. The algorithm comprises the following steps: (1) choose additive cation; (2) from database, find possible reactions under $NH_4^+$ (complexing agent) and water ($OH^-$, $H^+$); (3) extract reaction constant of zinc complex and additional cation complex, (4) calculate the equilibrium concentration of each complex ion under variable pH ($OH^-$) and [$NH_4^+$], (5) plot each complex ion distribution (normalized) under variable pH and [$NH_4^+$]; and (6) plot summed complex ions (normalized) under variable pH and [$NH_4^+$].

As noted above, an ASCII text file named morphology_control.txt (the "Source Code") is attached hereto. The Source Code comprises source code for a MATLAB® software program that implements the above algorithm, in this prototype.

Figure 6:
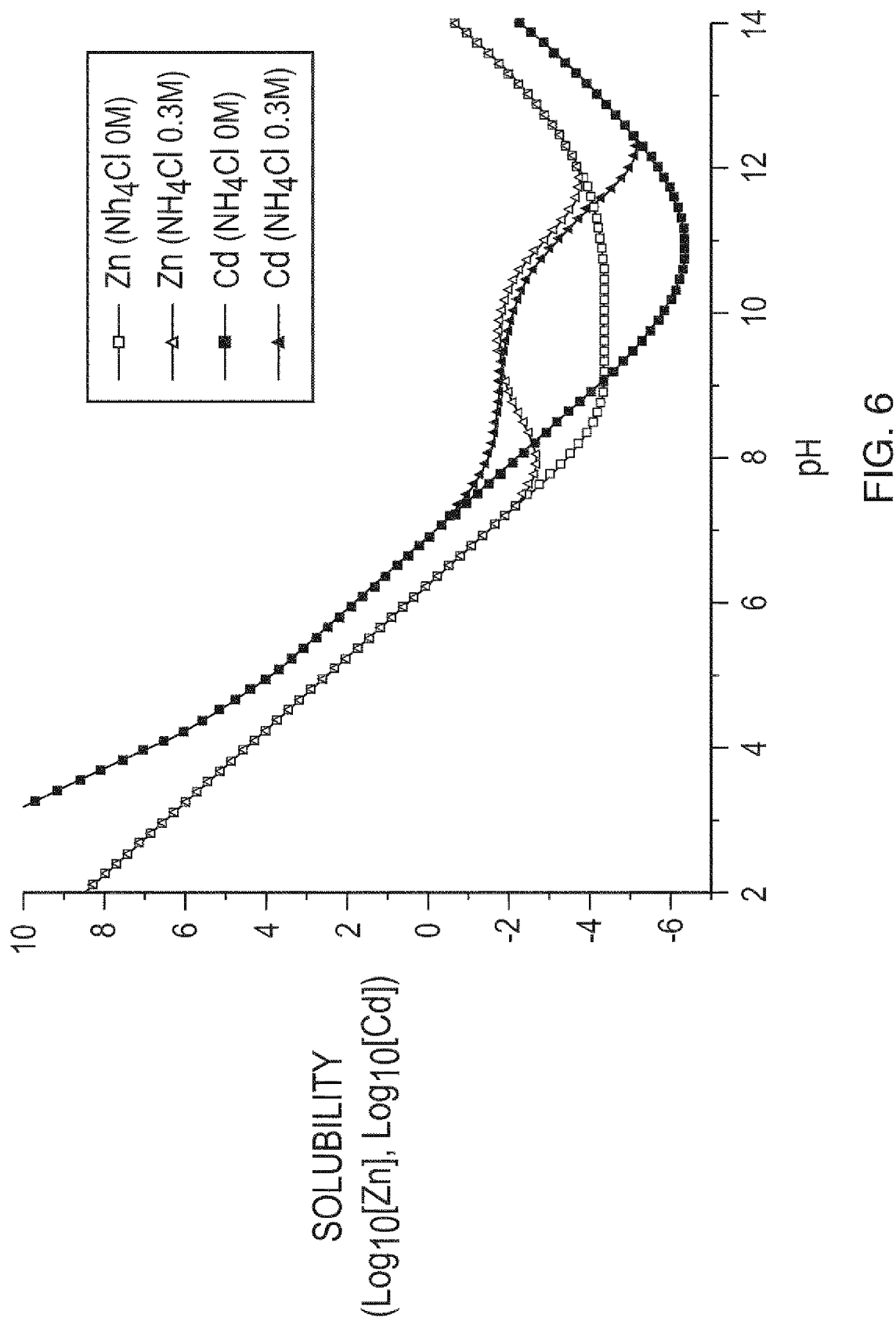
FIG. 6 is a graph comprising solubility plots for Zn and Cd in the reaction solution with two different concentrations of $NH_4Cl$, in a prototype of this invention.

FIG. 6 is a graph comprising solubility plots for Zn and Cd in the reaction solution with two different concentrations of $N_{H4}Cl$ (0M, 0.3M), in this prototype. Cd has different solubility from Zn. Cd also has a solubility increase around pH 8~ph 12 under $N_{H4}Cl$ existence because of Cd amine complex formation.

Figure 7:
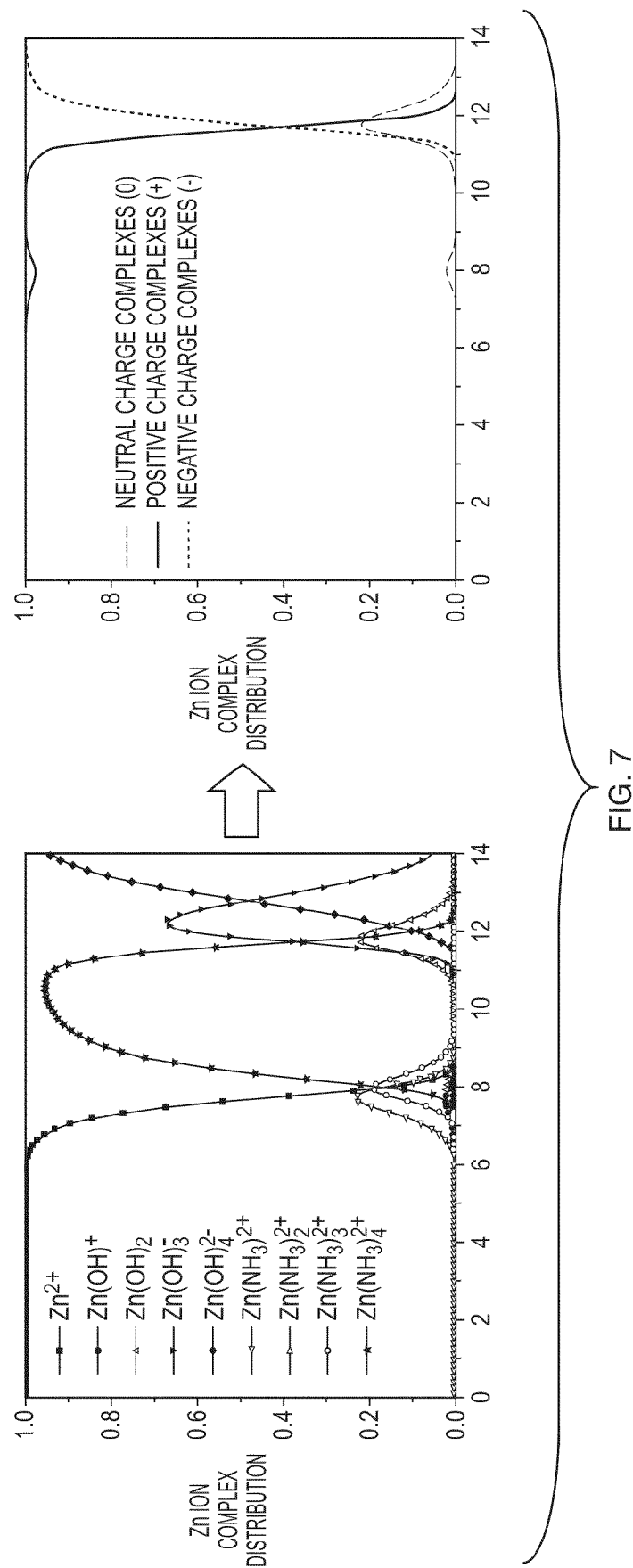
FIGS. 7 and 8 are graphs showing calculated Zn complex ion distribution and Cd complex ion distribution, respectively, at different pH with 0.3M $NH_4Cl$, in a prototype of this invention.
Figure 8:
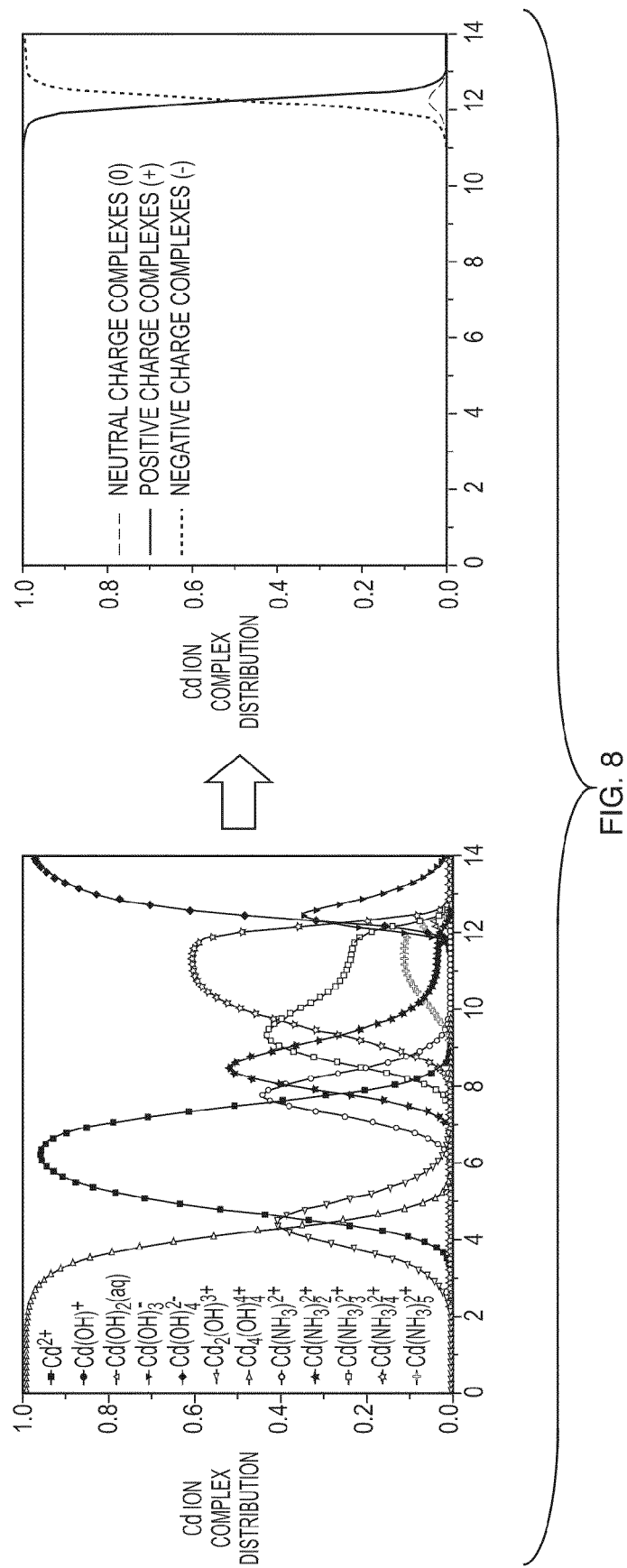

FIGS. 7 and 8 are graphs showing calculated Zn complex ion distribution and Cd complex ion distribution, respectively, at different pH with 0.3M $NH_4Cl$, in this prototype. Complexes with same polarity were added up to show the charge distribution of complexes. For Zn complexes case, positive charge value is the sum of $Zn(OH)^+$, $Zn(NH_3)^{2+}$, $Zn(NH_3)_2^{2+}$, $Zn(NH_3)_3^{2+}$, and $Zn(NH_3)_4^{2+}$. Negative charge value is the sum of $Zn(OH)_3^-$ and $Zn(OH)_3^{2-}$. Neutral charge value is $Zn(OH)_2(aq)$. A similar process was taken for Cd complex distribution, and charges with each polarity were calculated. According to these calculations, at pH 11, most Zn ions exist as positive charge complexes (96.3%) and most Cd ions exist as positive charge complexes (99.9%). Since the majority of Cd complexes are positive, these would be attracted to (0002) plane and suppress the positive Zn complexes attaching to (0002) plane. Vertical growth would slow down by this competing complex ion mechanism, but lateral growth will still happen, thereby forming nanoplates.

Figure 9B:
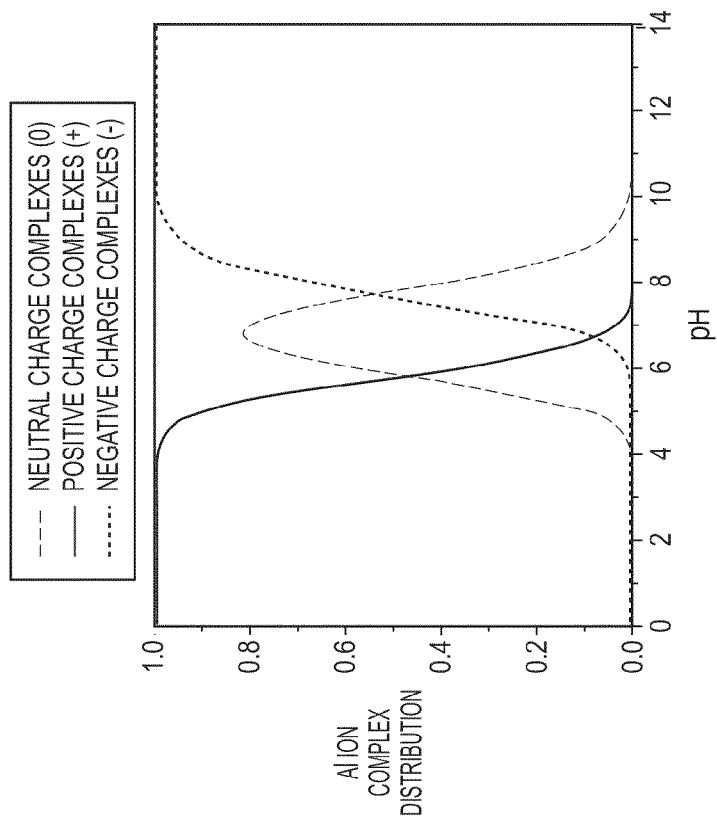
FIGS. 9A and 9B are graphs showing calculated Zn complex ion distribution and Al complex ion distribution at different pH with 0.3M $NH_4Cl$, in a prototype of this invention.
Figure 9A:
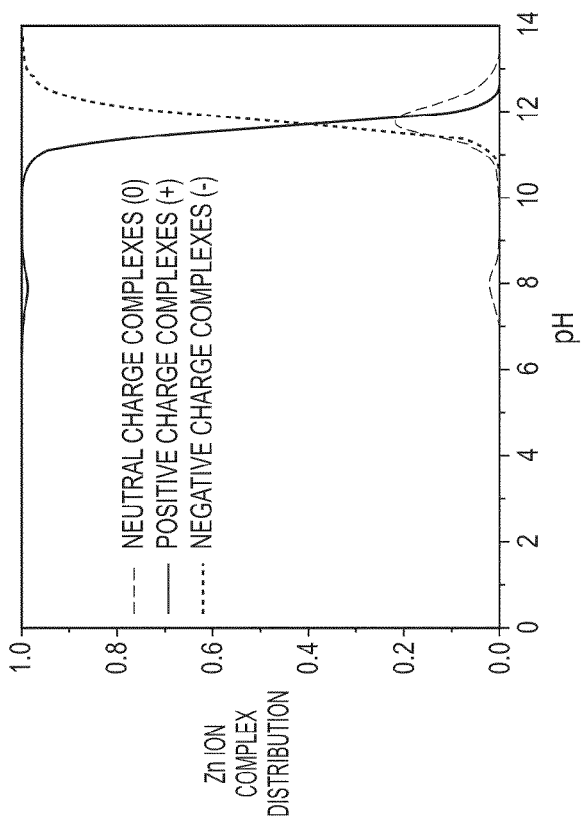

FIGS. 9A and 9B are graphs showing calculated Zn complex ion distribution and Al complex ion distribution, respectively, at different pH with 0.3M $NH_4Cl$, in this prototype. The complex distribution of Zn is different than it is in the Cd addition situation (see FIG. 7A), because Al and Cd have different chemical reactions with hydroxide and ammonia. According to these calculations, at pH 11, most Zn complexes are positive (96.4%), and most Al complexes are negative (99.9%). The majority of the Zn complexes (+), which are positively charged, are attracted to negative zeta potential (0002) plane and do not compete with majority of Al complexes (−), which are negatively charged. Thus, axial growth is not inhibited. The majority of Al complexes (−), which are negatively charged, are attracted to the positive ($10\bar{1}1$) plane and compete with the small minority of Zn complexes (−) that are negatively charged. Thus, electrostatic competition inhibits growth in the lateral direction. Overall, the addition of Al cations does not hamper vertical growth but does suppress lateral growth, resulting in a higher aspect ratio.

Figure 10B:
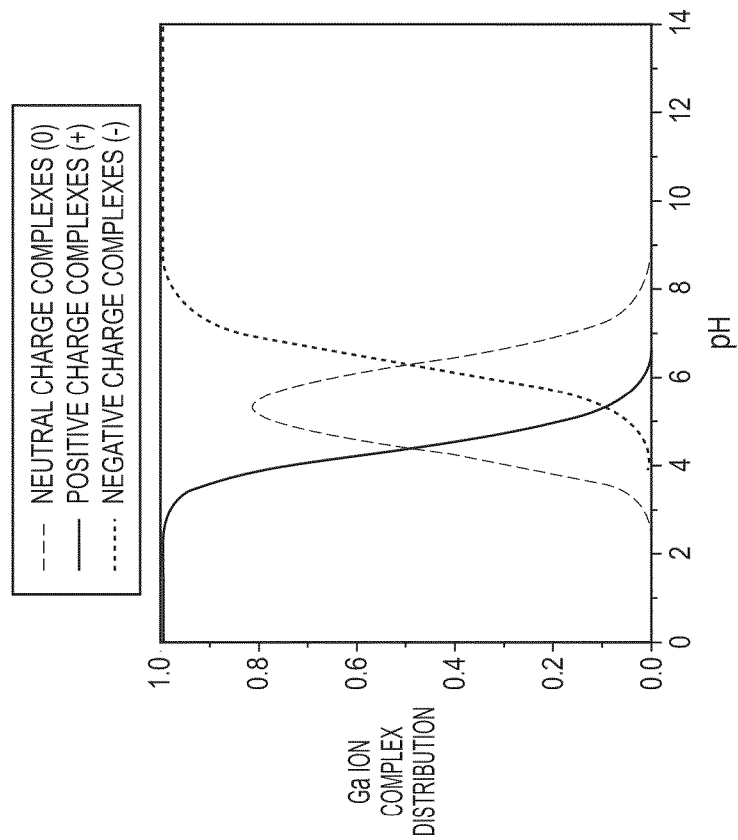
FIGS. 10A and 10B are graphs showing calculated Zn complex ion distribution and Ga complex ion distribution at different pH with 0.3M $NH_4Cl$, in a prototype of this invention.
Figure 10A:
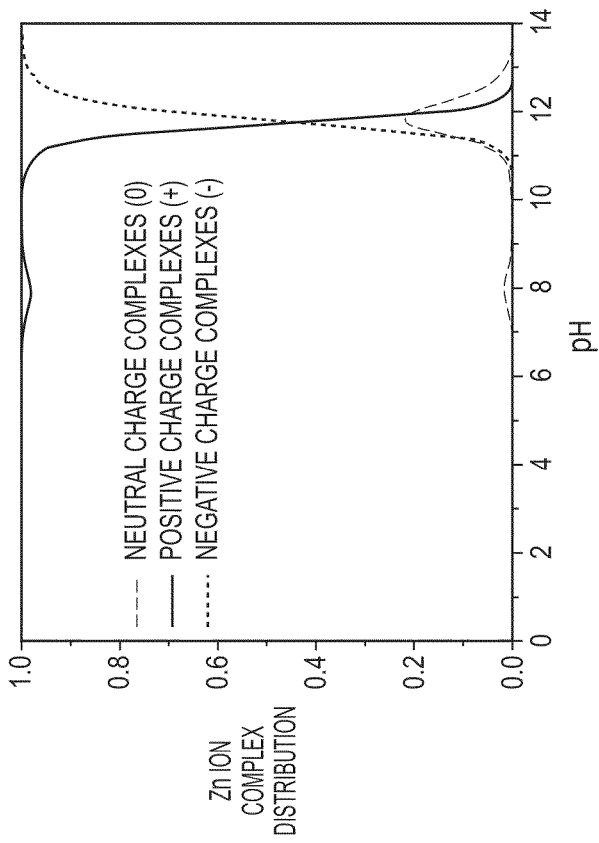

FIGS. 10A and 10B are graphs showing calculated Zn complex ion distribution and Ga complex ion distribution at different pH with 0.3M $NH_4Cl$, in this prototype. According to these calculations, at pH 11, most Zn complexes (96.4%) have positive polarity, and most Ga complexes (99.9%) have negative polarity. Thus, Ga suppresses growth in the ($10\bar{1}1$) plane and creates higher aspect ratio nanowires.

Figure 11B:
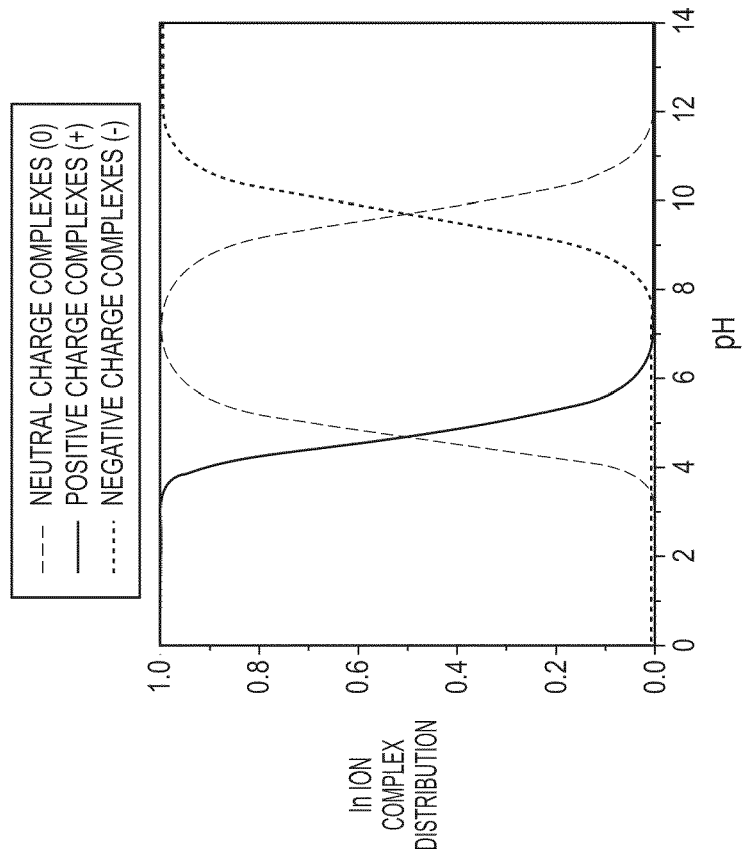
FIGS. 11A and 11B are graphs showing calculated Zn complex ion distribution and In complex ion distribution at different pH with 0.3M $NH_4Cl$, in a prototype of this invention.
Figure 11A:
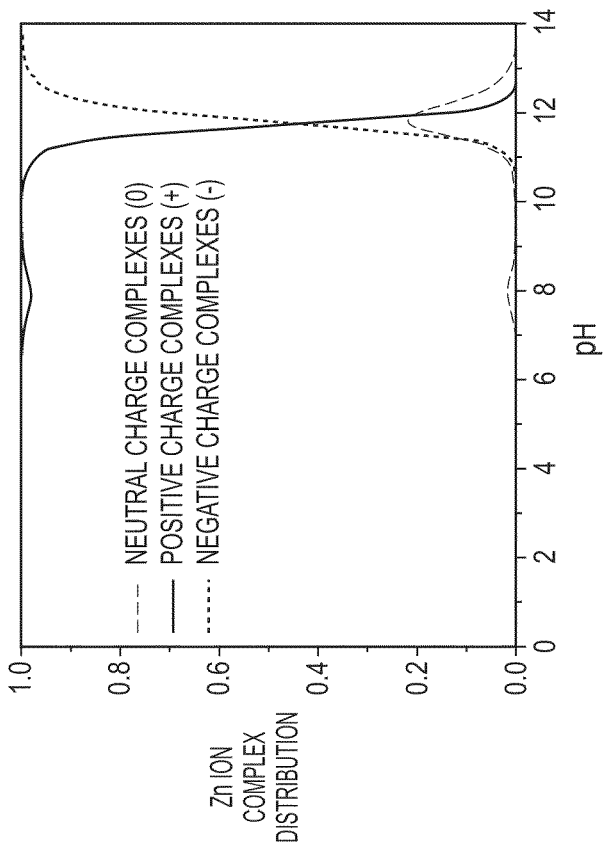

FIGS. 11A and 11B are graphs showing calculated Zn complex ion distribution and In complex ion distribution at different pH with 0.3M $NH_4Cl$, in this prototype. According to these calculations, at pH 11, most Zn complexes (96.4%) have positive polarity, and most In complexes (95.5%) have negative polarity. Thus, similar to Al and Ga, In suppresses growth in ($10\bar{1}1$) plane, resulting in a higher aspect ratio.

Figure 12B:
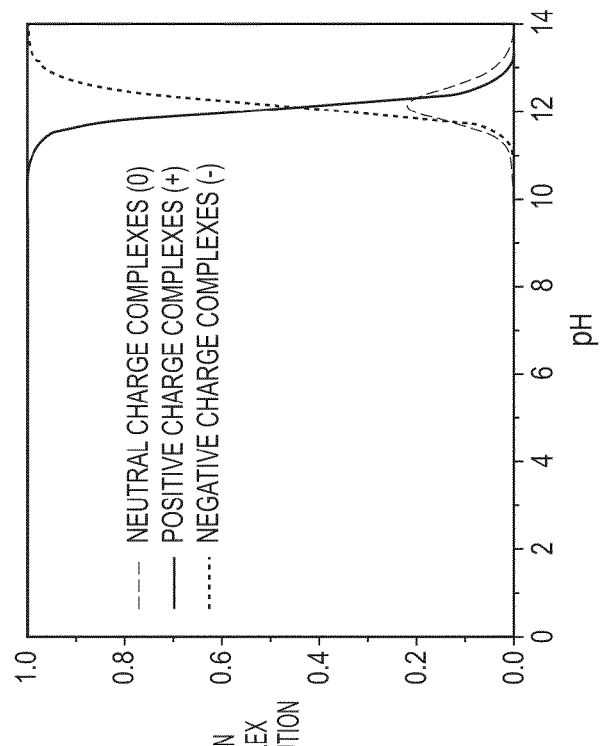
FIGS. 12A and 12B are graphs showing calculated Zn complex ion distribution and Cu complex ion distribution at different pH with 0.3M $NH_4Cl$, in a prototype of this invention.
Figure 12A:
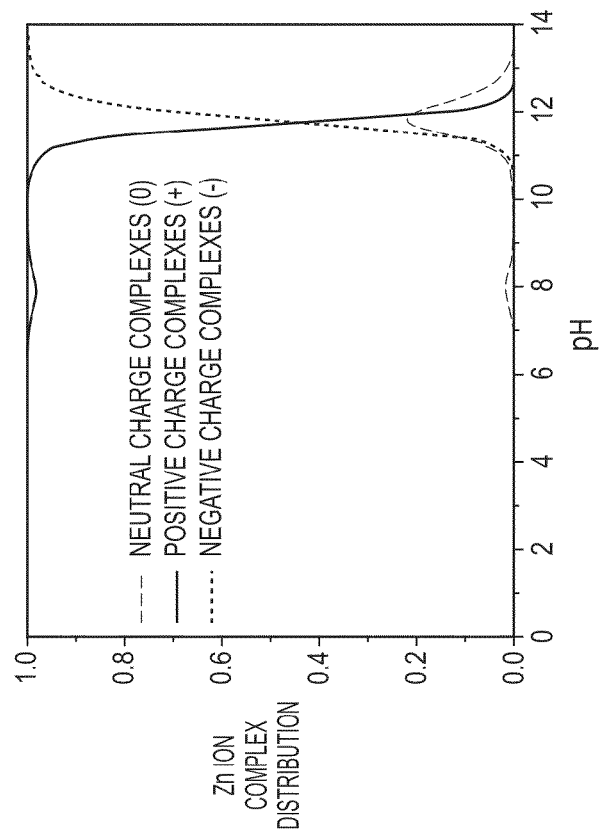

FIGS. 12A and 12B are graphs showing calculated Zn complex ion distribution and Cu complex ion distribution at different pH with 0.3M $NH_4Cl$, in this prototype. According to these calculations, at pH 11, most Zn complexes (96.3%) have positive polarity, and most Cu complexes (99.9%) have negative polarity. Thus, Cu complexes compete with most Zn complexes on access to the (0002) plane, thereby suppressing vertical growth. As a result, platelet shape structures form.

Figure 13B:
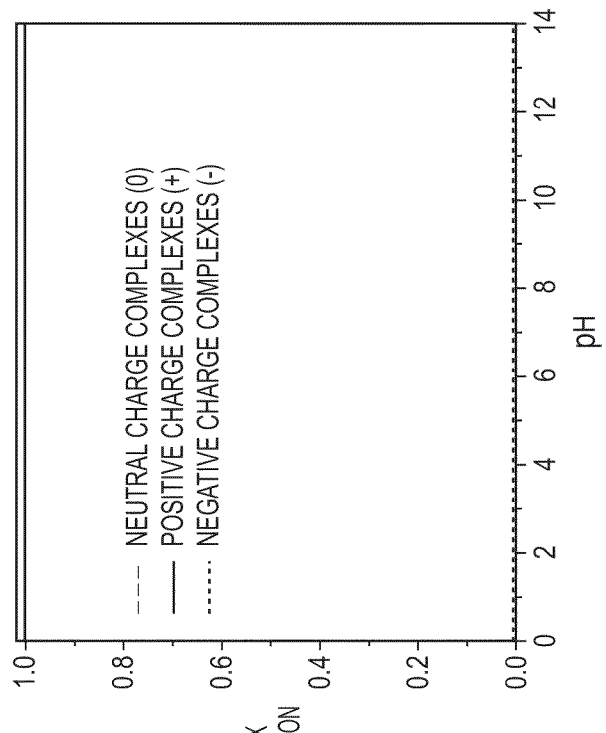
FIGS. 13A and 13B are graphs showing calculated Zn complex ion distribution and Mg complex ion distribution at different pH with 0.3M $NH_4Cl$, in a prototype of this invention.
Figure 13A:
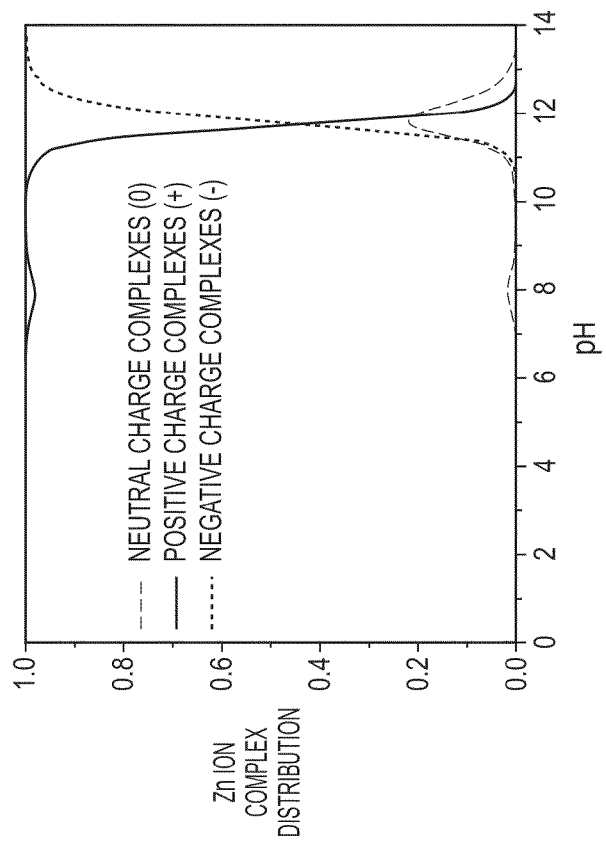

FIGS. 13A and 13B are graphs showing calculated Zn complex ion distribution and Mg complex ion distribution at different pH with 0.3M $NH_4Cl$, in this prototype. According to these calculations, at pH 11, most Zn complexes (96.4%) have positive polarity, and most Mg complexes (99.9%) have positive polarity. Similar to Cd and Cu, Mg suppresses growth in the (0002) plane and creates low aspect ratio nanoplates.

Figure 14B:
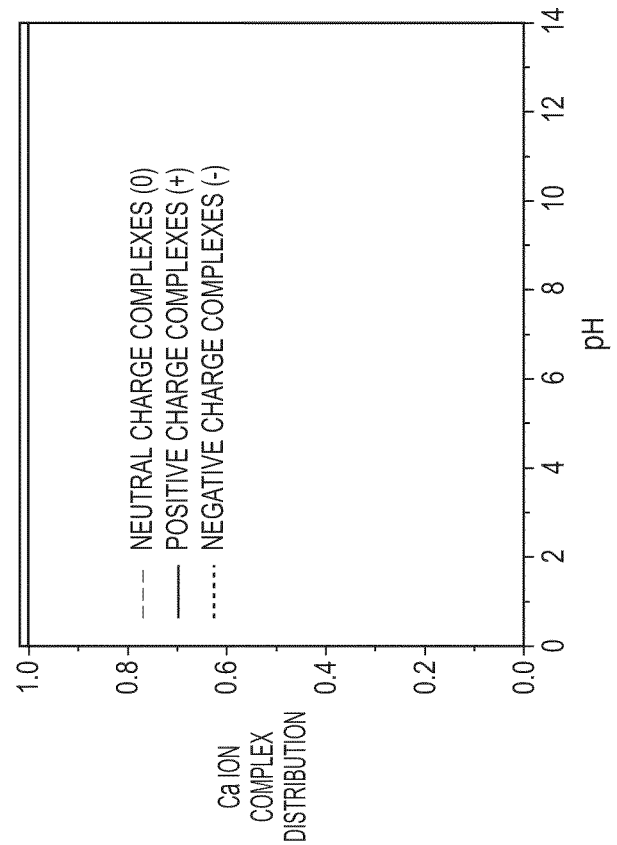
FIGS. 14A and 14B are graphs showing calculated Zn complex ion distribution and Ca complex ion distribution at different pH with 0.3M $NH_4Cl$, in a prototype of this invention.
Figure 14A:
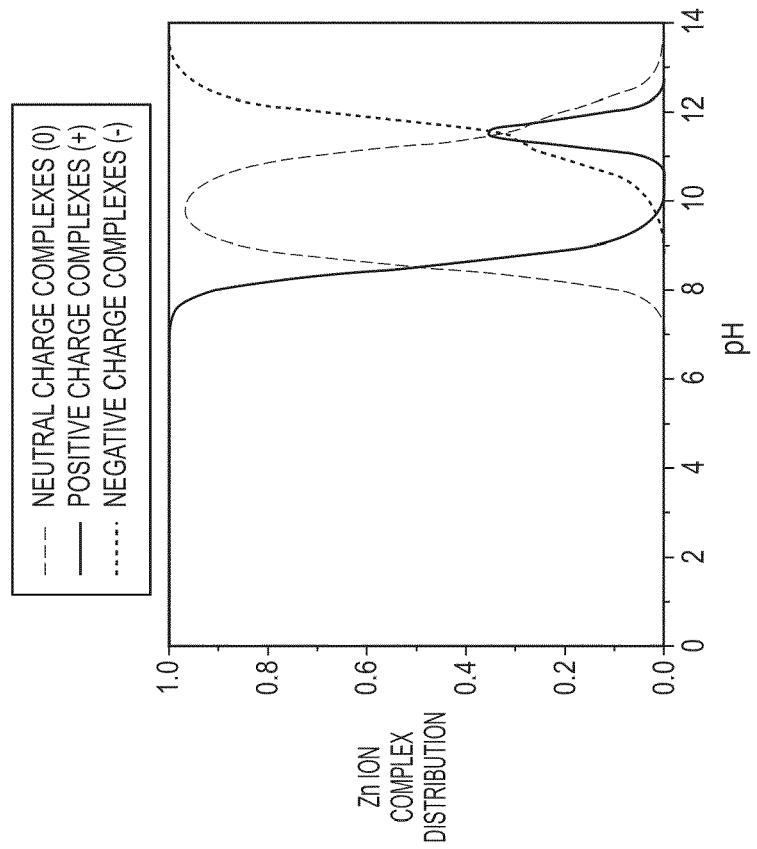

FIGS. 14A and 14B are graphs showing calculated Zn complex ion distribution and Ca complex ion distribution at different pH with 0.3M $NH_4Cl$, in this prototype. According to these calculations, at pH 11, Zn complexes are 69.0% neutral, 7.2% positive, and 23.8% negative, and Ca complexes have 100% positive polarity. Neutral Zn complexes can attach to either positive or negative zeta potential surfaces. At competes with positive Zn complexes for access to (0002) plane, thereby suppressing vertical growth. As a result, low aspect ratio structures form.

Figure 16:
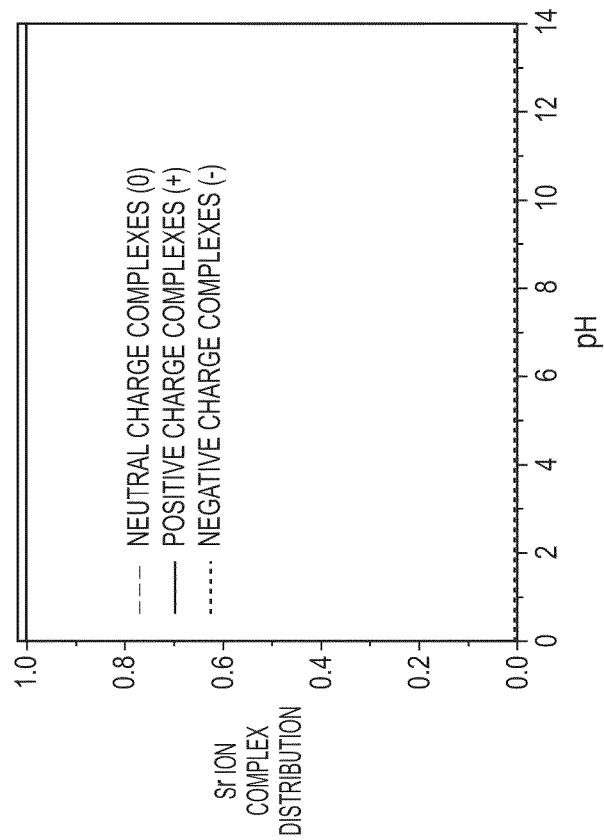
FIGS. 15 and 16 are graphs showing calculated Zn complex ion distribution and Sr complex ion distribution, respectively, at different pH with 0.3M $NH_4Cl$, in a prototype of this invention
Figure 15:
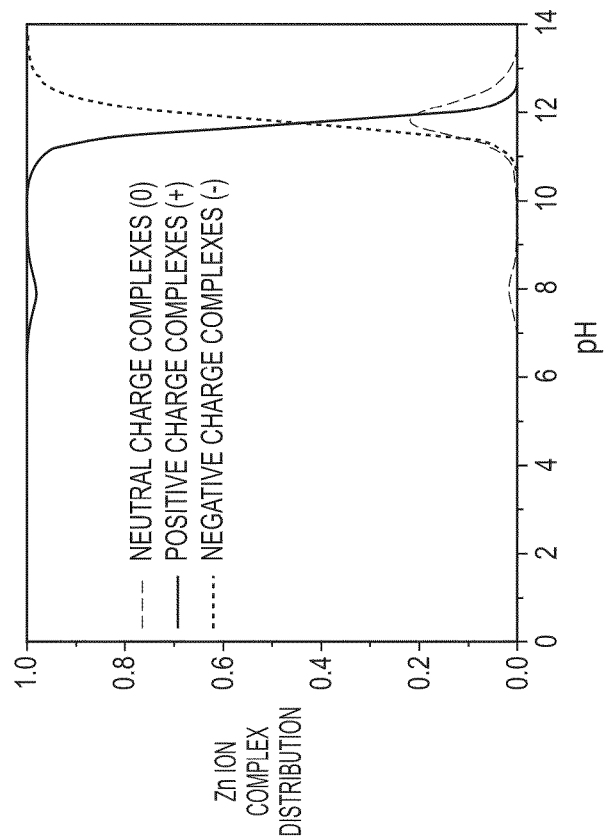

FIGS. 15 and 16 are graphs showing calculated Zn complex ion distribution and Ca complex ion distribution, respectively, at different pH with 0.3M $NH_4Cl$, in this prototype. According to these calculations, at pH 11, most Zn complexes (96.4%) have positive polarity, and most Sr complexes (100%) have positive polarity. Based on these calculations, one might expect Sr to suppress (0002) plane growth and decrease the aspect ratio of ZnO. But Sr did not cause an aspect ratio change in a prototype of this invention. This would come from the fact that $SrSO_4$ has extremely low solubility under DI water ($3\sim4\times10^{-7}$). The Sr used in this prototype was $SrSO_4$ (no hydrate form available). Within the concentration range (0.0002M~0.002M), $SrSO_4$ was still sedimented without dissolution when added to prepared solutions. However, the calculated situation assumes that Sr is fully dissociated from the initial form of chemicals.

In exemplary implementations of this invention, the tapered needle- or obelisk-like ends of high aspect ratio nanowires (>100 height/diameter ratio) are formed by multiple steps of hexagonal layers of growth with decreasing surface area, which is consistent with expected layer-by-layer growth mechanisms. In these implementations, the taper does not represent the ($10\bar{1}1$) facets that would otherwise be at 60° angles with the (0002) plane.

In this prototype, ZnO nanowires hydrothermally grown in the presence of non-zinc ions showed no evidence of material exchange or doping. No traces of the non-zinc ions (sulfates of Al, In, Ga, Cd, Mg, Cu and Ca) were incorporated into the growing crystal. The lack of incorporation during the low temperature aqueous synthesis differs from the ion exchange or doping that occurs at high temperature in organic solvents or co-introduction of gases in vapor-liquid solid (VLS) synthesis. Although the process used in this invention resembles in some respects surfactant-mediated morphological control during thermolysis reactions, a difference is the fact that the morphology tuning in the present invention is dominated by electrostatics.

A key advantage of this invention, in exemplary implementations, is the ability to controllably alter aspect ratio over >1000-fold range by introducing inorganic complexes, without their incorporation into the ZnO crystal or affecting the intrinsic ZnO material characteristics. In this prototype, the use of these inorganic complexes increased the range of control by several orders of magnitude vs. adjusting pH alone (<1.5-fold dynamic range under growth conditions that were still efficient).

According to principles of this invention, nanowire growth trends in hydrothermal synthesis may be predicatively modeled. Conventionally, such modeling is complicated by the use of complex charge species with unknown binding constants and lack of measurements of surface charges on growth face. For example, the possibility of polydentate binding or metal ion sequestering is seldom considered during the addition of polymeric carboxylates, sulfonates, and amines.

However, according to principles of this invention, such modeling may be simplified so as to predict morphology control by electrostatic face-selective growth inhibition. For example, in this prototype, where ($[NH_4Cl]\gg[ZnSO_4]$), the role of the sulfate counter-ion is minimized, thus leaving zinc hydroxide- and zinc amine-complexes as primary reactive intermediates whose relative concentrations can be calculated. That simplified model limits uncertainty in ligand-metal interactions via simplification of ligands (to sulfate and ammonium counterions only).

In exemplary implementations of this invention, face-selective electrostatic growth inhibition may be predictively modeled. In this modeling, speciation plots are made of the zinc complex ion distributions and non-zinc complex ion distributions, based on thermodynamic constants and pH-dependent surface charge. In a simplified scenario (e.g. where the relative concentration of non-zinc ions is =<20%), the plots can usually be made separately because the ions have minimal effect on the zinc complex-ion distribution. In this modeling, non-zinc complex ions are treated as ligands that inhibit growth by limiting access of reactive zinc intermediates via face selective crystal growth inhibition. A high concentration on non-zinc complex ions of a specific charge will inhibit growth at the crystal face of opposite charge.

In some exemplary implementations of this invention, microfluidic channels are employed. By coupling chemical reaction with fluid dynamics, spatial and temporal control of nanowire growth are achieved, over a range of parameters such as ion concentration, pH, temperature, flow rates, and flow geometry.

In this approach, each microfluidic growth channel allows nanowires to be synthesized with different properties, so that nanowires with different properties may be synthesized in parallel. For example, by varying the identity and concentration of additional non-zinc cations, the aspect ratio of nanowires grown in different microfluidic channels may be varied. This technique may be used for finding optimized reaction parameters and creating nanowire channels with different aspect ratio by divalent or trivalent ion addition in the solution. Furthermore, it may be used to achieve a growth rate that is greater than in bulk solution synthesis under the same conditions by minimizing the depletion of reactant ions using continuous flow. Integrated control of reaction conditions allows the in-situ fabrication of nanowire-based electronics. Using the above technique, a novel, continuous gradient control of the nanowire growth rate may be achieved along the channel length. Also, 3D geometrically complex nanostructures may be synthesized in various flow channels.

Figure 17:
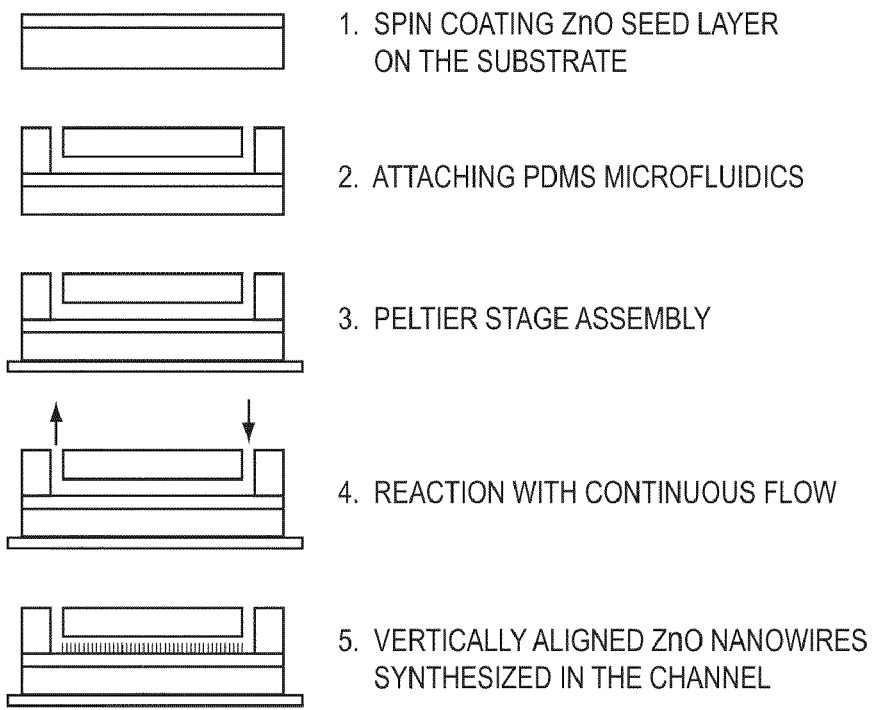
FIG. 17 is a high-level schematic of microfluidic ZnO nanowire synthesis, in a prototype of this invention.

FIG. 17 is a high-level schematic of microfluidic ZnO nanowire synthesis, in a prototype of this invention. After spin coating or RF sputtering a thin ZnO seed layer on a pre-cleaned substrate, molded polydimethylsiloxane (PDMS) fluidic channels are attached to the substrate either by mechanically pressurized contact or plasma bonding. Supersaturated solutions with various ion concentration and pH ($ZnSO_4$, $NH_4Cl$, and NaOH) flow through each channel, and synthesize nanowires by hydrothermal reaction at temperatures from 40 C to 80 C controlled by a Peltier stage.

Figure 18:
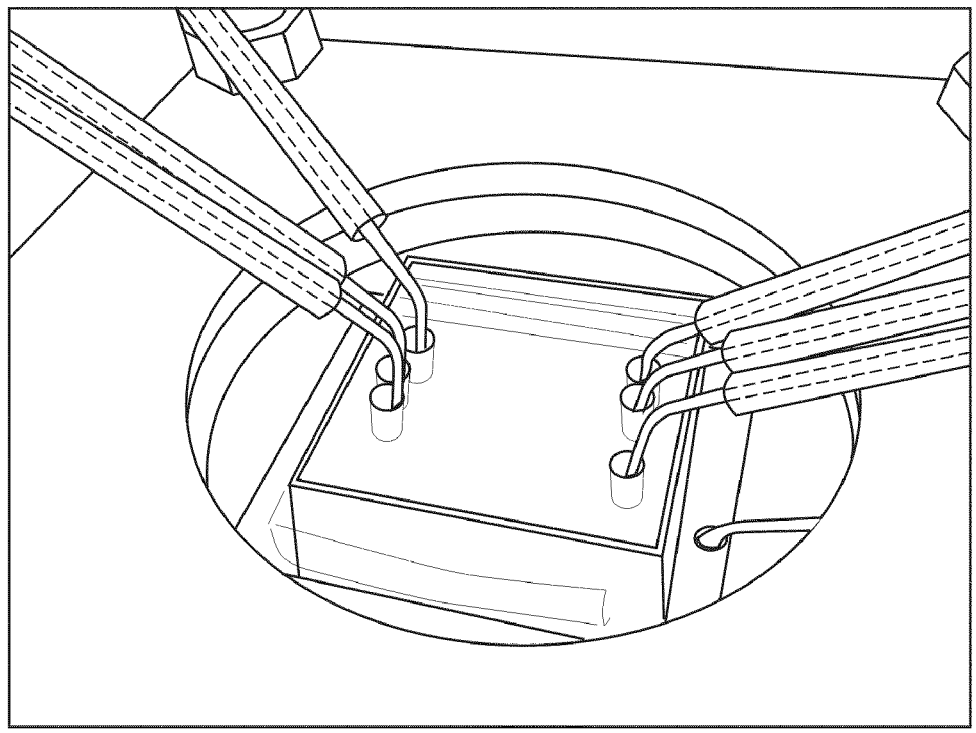
FIG. 18 is a perspective view of a microfluidic device with three parallel channels, in a prototype of this invention.

FIG. 18 is a perspective view of a microfluidic device with three parallel channels, in a prototype of this invention.

In a prototype of this invention, microfluidics ZnO nanowire synthesis was performed as follows: Optically patterned SU-8 was used as a mold for PDMS layer. After spin coating SU-8 2050 at 1000 rpm (for 80 um height) for 40 seconds on the pre-cleaned 4" Si wafer, the substrate was prebaked at 65 C for 10 minutes, followed by 90 C for 30 minutes on a hot plate. Using transparency mask designed with Autocad®, the SU-8 photoresist was exposed at UV with 50 mW/$cm^2$ for 40 sec, and post baked at 65 C for 1 minute, followed by 95 C at 10 minute. Finally, the wafer was developed by SU-8 developer with active agitation for 10 minutes, then washed with DI water and dried under nitrogen.

For replicating SU-8 master mold, approximately 40 g of liquid polydimethylsiloxane (PDMS) pre-polymer at a component A to B ratio of 10:1 was poured onto the mold to a thickness of 1 cm, followed by curing in a convection oven at 80 C for 3 hours. The PDMS layer was then peeled off from the master, and individual device was cut off with a razor blade. Holes for the inlets and outlets were cored with a 0.75 mm beveled needle. This PDMS was briefly cleaned with IPA again and put on top of a ZnO seed layer coated substrate. Custom made holder (laser cut/waterjet parts) was used to pressurize PDMS/substrate on top of peltier stage connected to microcontroller.

Flexible tubing (0.75 mm ID) was connected to PDMS inlets and outlets by intermediate stainless steel tube (0.082 mm OD). Tubing was connected to 1~5 mL syringe filled with supersaturated solution. Flow rate was controlled by mechanical syringe pump. After microfluidic nanowire synthesis was finished at fixed time and flow rate, PDMS layer was detached from the substrate, and cleaned with DI water, followed by nitrogen dry.

This microfluidic synthesis with chemical solution is analogous to chemical vapor deposition (CVD) process. Both systems involve chemical reaction and flow of either solution of gas. Each have a diffusion limited reaction condition (when reaction is fast enough), or reaction limited condition (when diffusion is fast enough). However, there are major differences between microfluidic synthesis and CVD synthesis. In CVD, deposition generally occurs on the entire surface area unless the surface is prepatterned for selective deposition. In microfluidic synthesis, deposition occurs only at fluidic channels, so site specific growth is automatically achieved. Also, parallel growth with different materials can happen at the same time, compared to CVD methods that require multiple lithography and deposition steps to define each material section.

In a prototype of this invention, a serpentine structure of a microfluidic channel with 100 um width, 80 um height, and 35 cm length was fabricated. Nanowire growth was performed with this fluidic channel at a fixed supersaturation solution ($ZnSO_4$ 0.01M, $NH_4Cl$ 0.3M, pH 11 by NaOH) and a fixed flow rate of 0.3 mL/h for 5.5 hrs. The only variable was a reaction temperature from 40 C to 60 C. FIGS. 19A and 19B are diagrams of this serpentine channel. In this prototype, nanowire growth varied by location within the serpentine channel, being greatest at the inlet port, and decreasing as distance from the inlet port increased. At these temperature conditions and flow rate, the process seems to follow the diffusion limited regime because the growth varies with location, and closer to the source has a higher growth rate.

FIG. 19C is a diagram that shows how nanowire geometry may vary within a single microfluidic channel, in exemplary implementations of this invention. In the example shown in FIG. 19C, nanowires decrease in height as the solution goes further into the microfluidic channel.

Advantageously, ZnO nanowire synthesis may be performed in a microfluidic system in a controlled manner. The synthesis of vertically aligned zinc oxide (ZnO) nanowires in a microfluidic device allows precise control over key parameters in hydrothermal synthesis and the creation of complex geometries via fluidic control.

In a prototype of this invention, nanowires of different morphology are synthesized in individual channels of a microfluidic manifold, using solutions of identical composition to those used in bulk syntheses; the resultant aspect ratios of the nanowires are approximately the same.

When nanowires were synthesized in a continuous flow polydimethylsiloxane microreactor (PDMS, 100 μm channel width×80 μm channel height, typical flow rate=1.2 mL/hour), observed synthesis rates were five-fold higher in the microfluidic device when compared to bulk solution. This increase in growth rate is due to mass transport (i.e., the constant replenishing of reagents and clearance of homogenous nucleants that consume reactants in solution). The nanowire vertical growth rate in this microfluidic device was typically 1.5-2 μm/hour, as compared to an optimized batch reactor, which was typically 0.3-0.4 μm/hour.

Beyond improved mass transport, hydrothermal synthesis in a microfluidic environment allows parallel screening of synthesis parameters with minimal reagent consumption. This makes it easier to optimize growth conditions. In this parallel screening, different solutions may be used (and different reactions may occur) on a single chip.

Advantageously, with microfluidic channels, geometry may vary not only between different channels (e.g., due to different non-zinc metal cations being added to the solutions in different channels to achieve different aspect ratios), but also within a single channel (e.g., nanowire growth may be greatest at the inlet port and decrease further into the channel).

Advantageously, this invention allows morphologically controlled nanowire synthesis in microfluidic polymeric environments. Such synthesis may be used to fabricate multi-layer structures, including all-inorganic multi-layer structures and multi-layer pixilated structures.

Advantageously, this invention allows patterned in-situ fabrication. In such fabrication, a nanostructure may be grown in place using the geometry of the microfluidic to define the pattern.

Advantageously, in some implementations of this invention, a microfluidic device may be not only a patterning device, but also a synthesis environment, fluid manifold and packaging. For example, PDMS may be used in the microfluidic fabrication and incorporated into the final product. PDMS has a high index of refraction. The PDMS may be used as a lens element of an LED or to create an internally reflective cavity for a sensor.

Advantageously, microfluidic nanowire synthesis may be used for the in-situ fabrication of morphologically diverse nanostructure-based integrated devices. These integrated devices may have highly tunable geometrical, electrical and optical properties. By physically coupling growth and transport dynamics of reactants in a continuous flow microfluidic reactor, the programmed synthesis of complex geometrical patterns may be achieved within enclosed geometries.

This invention has many practical applications. A few examples are discussed below.

One application of this invention is for the production of field emission devices. By adding non-zinc cations, high aspect ratio ZnO nanowires may be produced, with tips that sufficiently sharp to act as efficient field emitters.

The vertically aligned morphology of ZnO nanowires may be used to advantage for enhancing field emission, because the electron emission efficiency can be highly improved by high aspect ratio of structures.

In a prototype of this invention, for fabrication of a field emission device, the tip geometry of ZnO nanowires was controlled with cation addition during nanowire synthesis. ITO glass was pre cleaned, followed by 30 nm thick ZnO seed layer deposition by RF sputtering (150 W, 20 mTorr, 12 sccm Ar). Different morphology nanowires were synthesized on the substrate with various solution bath conditions similar manner described in chapter 4. All basic solution was prepared with zinc sulfate ($ZnSO_4$, 0.01M) and ammonium chloride ($NH_4Cl$, 0.3M) in 100 mL deionized solution. Five different cation sulfate ($Al_2(SO_4)_3$: 0.001M, 0.002M/$CdSO_4$: 0.001M, 0.002M/No addition) was introduced to each solutions, then sodium hydroxide (NaOH) was added to adjust pH to 11. The substrates were introduced to each bath to grow nanowires on the ITO substrates for 20 hrs. After being removed from the solution, the substrate was washed with DI water followed by nitrogen dry. To expose ITO layer for IV characterization, corner ZnO nanowire and ZnO seed layer was etched by diluted HCl (2M) with cotton swab, then cleaned with acetone. A counter electrode was prepared with 1/16" diameter tungsten tip covered with Teflon on the side for electrical insulation. This electrode was attached to three axis positioner with micrometer for the high precision spacing adjustment. This setup was introduced in vacuum chamber ($5 \times 10^{-6}$ mbarr), and a high voltage measurement unit was connected through electrical feed through for IV characterization.

For phosphor light emission excited by field emitted electrons, nanowire grown ITO substrate and P22 phosphor coated ITO substrate were sandwiched with 190.5 um spacer in a vacuum chamber ($5 \times 10^{-6}$ mbarr), then a high voltage supply was used for field emission.

Figure 20:
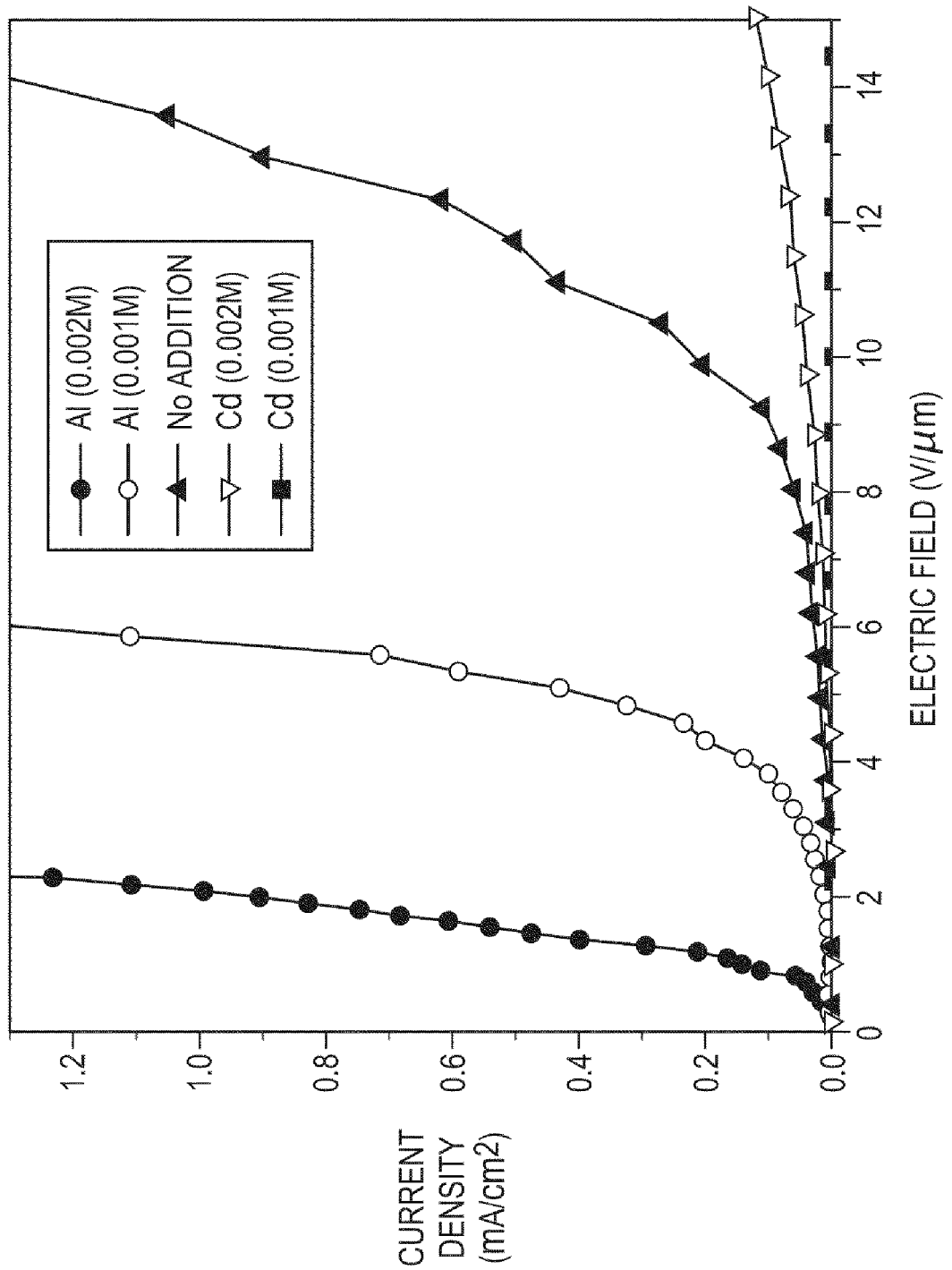
FIG. 20 is a graph of field emission measurements of nanowire grown using a prototype of this invention.

FIG. 20 is a graph of field emission measurement with five different nanowire/nanoplate grown on ITO with Al 0.002M (aspect ratio: 103.1), Al 0.001M (aspect ratio: 101.9), no addition (aspect ratio: 44.9), Cd 0.001M (aspect ratio: 10.1), and Cd 0.002M (aspect ratio: 1.3). Field emission was enhanced with the samples with higher aspect ratio. Higher aspect ratios showed significant decrease in turn on voltage, indicative of an efficient field emission system. A further factor came into play: ZnO nanowire with Al addition creates a sharp tip, so real tip diameter (r) is much smaller than diameter measured at the middle of the nanowire, so d/r (length/tip diameter) is much higher than aspect ratio stated above. Thus, the Al 0.002M sample and Al 0.001M sample have large differences in field emission even though aspect ratio values are in a similar range.

Figure 21:
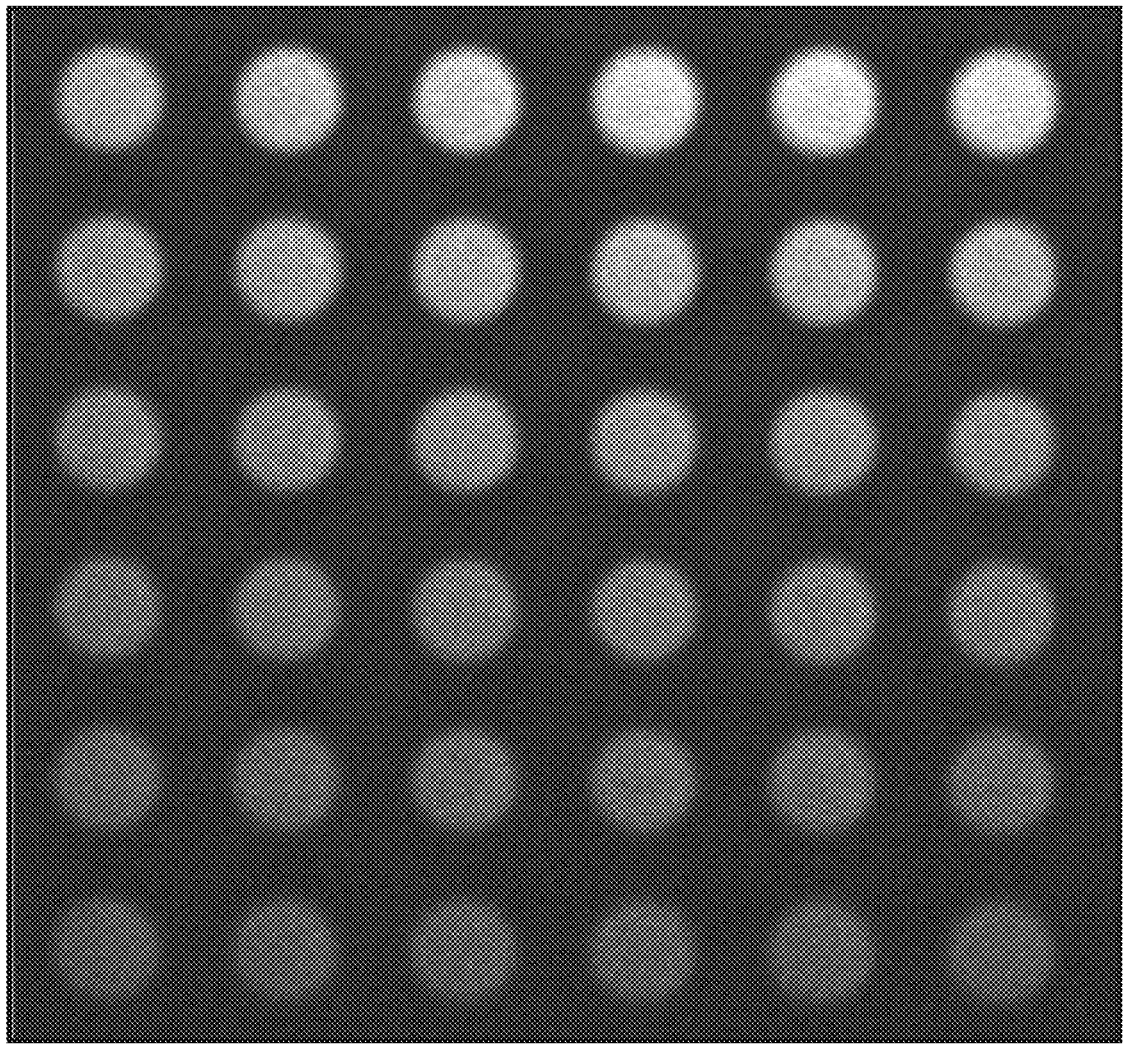
FIG. 21 is a photograph of light emission from P22 phosphor excited by filed emitted electrons from nanowires, in a prototype of this invention.

FIG. 21 is a photograph of green light emission from P22 phosphor excited by filed emitted electrons from nanowires, using this prototype.

In this prototype, by varying only the competing ions in the inorganic batch process, both low-aspect nanoplatelets and high-aspect ratio nanowires were synthesized. The latter were sufficiently sharpened to create field-emitters with emissivity equivalent to carbon nanotubes. These field emitters may be used to advantage in many different contexts, such as high efficiency field emission display, portable x-ray source machines, and parallel miniature electron beams.

Another application of this invention is to produce a nanowire embedded Alternating Current Electroluminescent (ACEL) device. By increasing the aspect ratio of the embedded nanowires with morphology control, the performance of the ACEL device is improved.

This invention may be used to advantage for the fabrication of polymer-based, nanowire-embedded AC electroluminescent devices (NW-ACEL). In exemplary implementations, this invention is well-suited for such fabrication because it allows low-temperature processing in an aqueous environment and enhances field emission.

In a conventional ACEL device, accelerated electrons from the emitter excite dopant atoms in a phosphor, leading to photon emission upon atom relaxation to the ground state. Despite good performance in viewing angle, contrast, and operating temperature, conventional ACEL devices have poor efficiency.

In a prototype of this invention, performance was improved with high aspect embedded nanoneedles: A NW-ACEL device was fabricated with nanoneedles embedded into a 300 nm-thick ZnS:Mn phosphor layer to enhance field emission from the dielectric (the ZnO seed layer). The device was fabricated on a flexible, metal-coated, polyethylene terephtalate (PET). The yellow/orange electroluminescence (EL) spectrum matched the photoluminescence (PL) spectrum of the phosphor, indicating that the nanoneedles acted as a field-enhancement layer, as opposed to directly emitting by electron-hole recombination within the semiconductor.

Figure 22C:
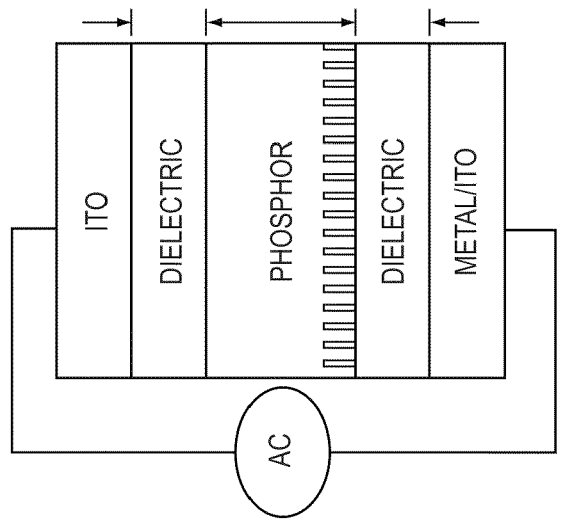
FIG. 22C is a diagram of a nanowire embedded ACTFEL device, in an implementation of this invention.
Figure 22B:
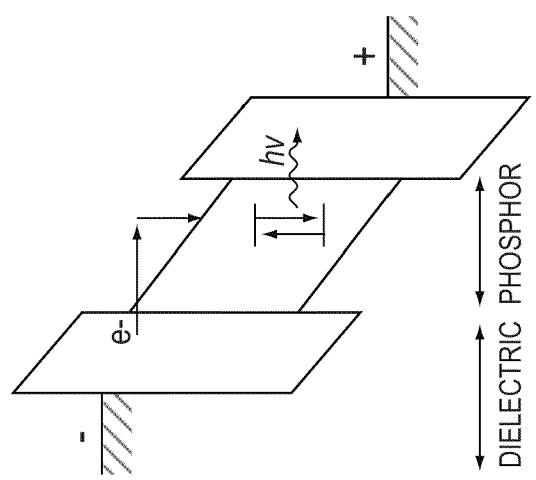
FIG. 22B is a diagram of the band structure of ACTFEL multiple layers when a pulse voltage is applied.
Figure 22A:
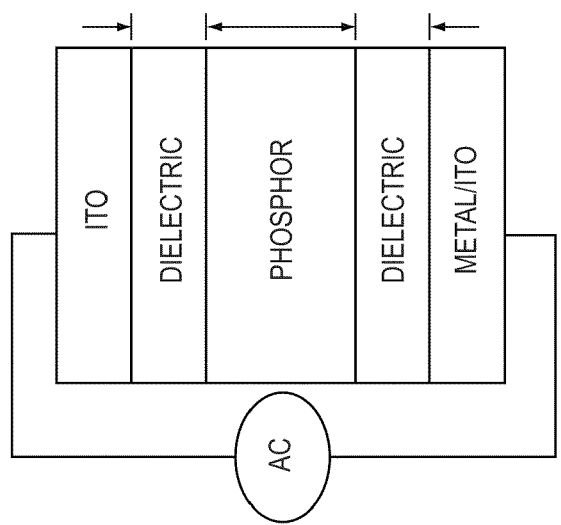
FIG. 22A is a diagram of a conventional alternating current thin film electroluminescent (ACTFEL) device.

FIG. 22A is a diagram of a conventional Alternating Current Thin Film Electroluminescent (ACTFEL) device. FIG. 22B is a diagram of the band structure of ACTFEL multiple layers when a pulse voltage is applied. FIG. 22C is a diagram of a nanowire embedded ACTFEL device, in an implementation of this invention. In this implementation, ZnO nanowires are embedded between the electrode and the phosphor in order to increase light emission efficiency by the field enhancement effect.

As shown in FIG. 22A, a conventional thin-film electroluminescent device consists of five stacked layers, conductor/insulator/phosphor/insulator/conductor/substrate. The phosphor layer is generally polycrystalline zinc sulfide (ZnS) doped with atoms such as Mn, Ce, and Tb with concentration of an order of 1 mol %. The insulator layers are generally barium titanate ($BaTiO_3$), silicon oxide ($SiO_2$), or aluminum oxide ($Al_2O_3$) behaving as capacitors. At least one of the conducting layers is transparent for the light emission to be possible from overlapped electrodes.

A principal application of conventional AC electroluminescent (ACEL) devices is for flat panel displays. A conventional ACEL has several useful characteristics for display, including wide viewing angle, high contrast, and wide operating temperature range (−100 C~100 C). However, the low efficiency of conventional ACELs compared to current p-n junction LED devices limits their applications only to the rugged environment display.

In a prototype of this invention, nanowire structures are introduced between phosphor layer—dielectric—electrode interfaces of an ACEL device, in order o increase its efficiency. Thus, a nanostructure embedded ACEL device is created. Since high aspect ratio tip can create field enhancement compared to flat structure, it will induce more tunneling of electrons to the phosphor layer and excite dopant atoms more effectively for efficient light emission. This prototype was fabricated using morphology control of ZnO nanowires.

Figure 23:
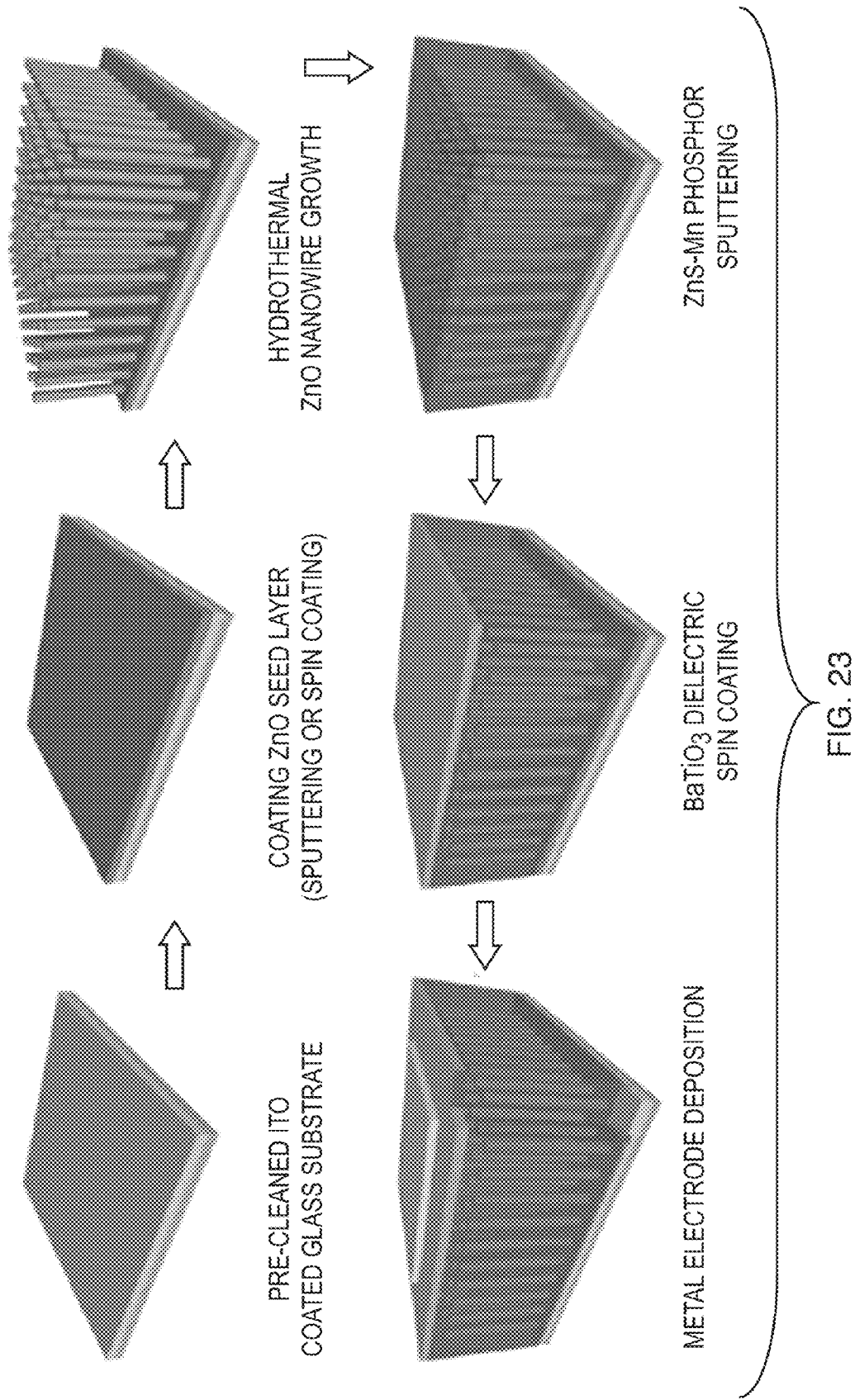
FIG. 23 is a flow chart of steps comprising the fabrication of a nanowire embedded ACEL device, in a prototype of this invention.

FIG. 23 is a flow chart of steps comprising fabrication of a nanowire embedded ACEL device, in this prototype. Pre-cleaned ITO glass (Delta Technologies) was optically patterned to form transparent electrode, then 30 nm ZnO seed layer was coated by RF sputtering (AJA International) at 150 W, 20 mTorr with 10 sccm Ar for 14 minutes. In the case of a flexible device, 30 nm thin Au was thermally evaporated to pre-cleaned PET (0.01" thick, McMaster Carr) by shadow mask as a semi-transparent electrode. For nanowire synthesis bath preparation, variable additional cation sulfate ($Al_2(SO_4)_3$ 0.002M, $CdSO_4$ 0.002M, or none) was added to fixed concentration of zinc sulfate ($ZnSO_4$, 0.01M) and ammonium chloride ($NH_4Cl$, 0.3M) in 100 mL deionized solution, then sodium hydroxide (NaOH) was added to adjust pH to 11. The substrate was then introduced to each bath to synthesize nanowires or plates with 1.2 um thick (no addition bath: 4 hr, Al 0.002M bath: 6 hr, Cd 0.002M bath: 20 hr), then removed from the bath, washed with DI water, and dried under nitrogen. On top of these nanostructures, 300 nm ZnS:Mn phosphor layer was deposited by RF sputtering (110 W, 3 mTorr, 12 sccm Ar, 0.8 at. % Mn target, at 250 C (60 C for flexible PET device). Barium titanate ($BaTiO_3$) paste was used to deposit 13 um thick dielectric layer by spin coating at 4000 rpm with 50 sec, followed by heat treatment at 150 C for 20 minutes. Top electrode was either deposited with Al by RF sputtering (160 W, 3 mTorr, 12 sccm Ar, 100 nm) or brush painted using a graphite paste.

Figure 24:
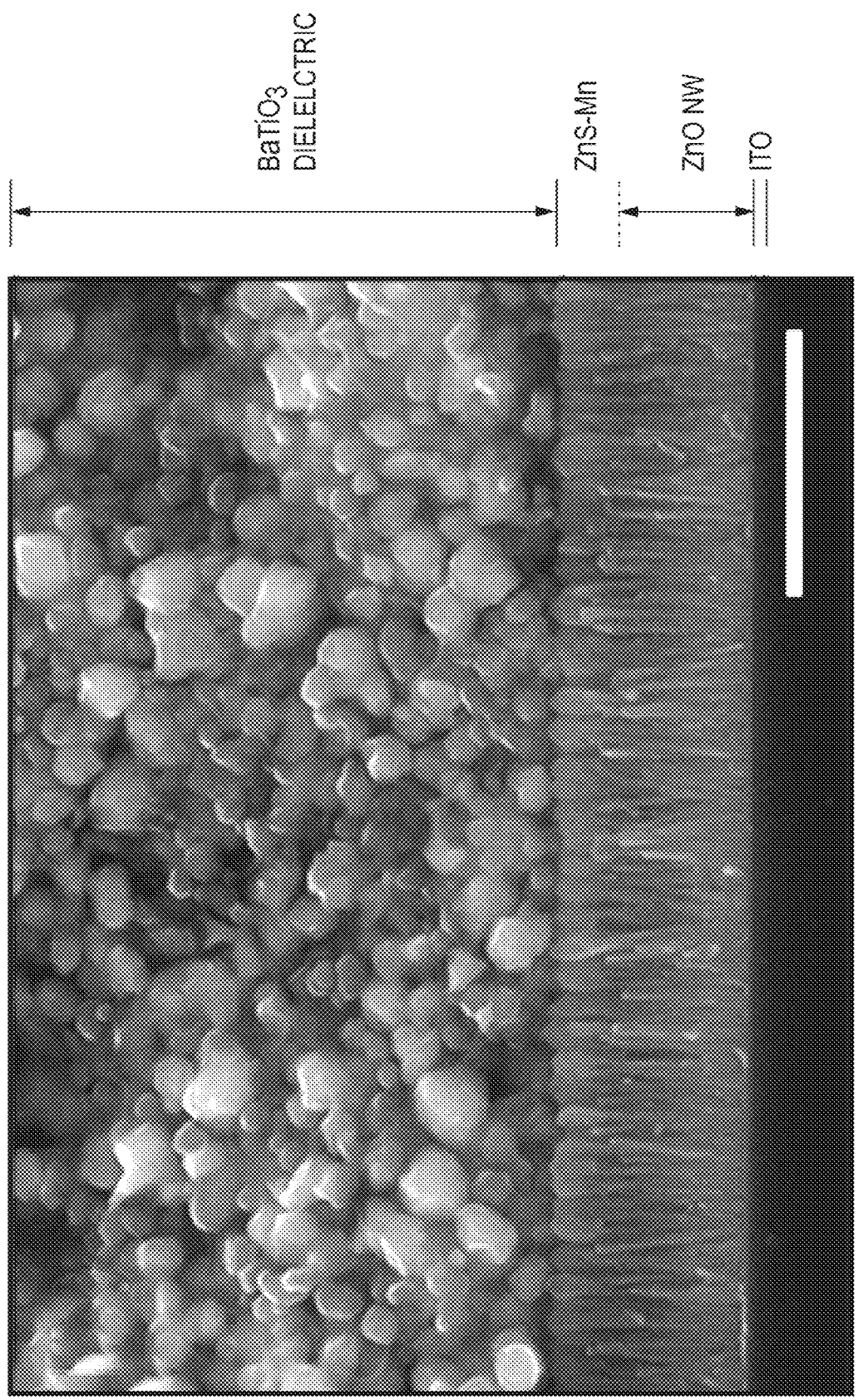
FIG. 24 is a cross section SEM of 300 nm thick ZnS:Mn sputtered on BaTiO3 dielectric spin coated over ZnS:Mn/ZnO nanowires, in a prototype of this invention.

FIG. 24 is a cross section SEM of 300 nm thick ZnS:Mn sputtered on BaTiO3 dielectric spin coated over ZnS:Mn/ZnO nanowires, in a prototype of this invention. On top of 1.2 um thick ZnO nanowires, 300 nm thick ZnS:Mn was conformally coated between nanowires, followed by 13 um thick $BaTiO_3$ dielectric deposition. BaTiO3 is advantageous because it has high dielectric constant ($\in$=15~20 in amorphous, $\in$>100 in pole oycrystalline) and reasonable breakdown field (~0.1 MV/cm).

Figure 25:
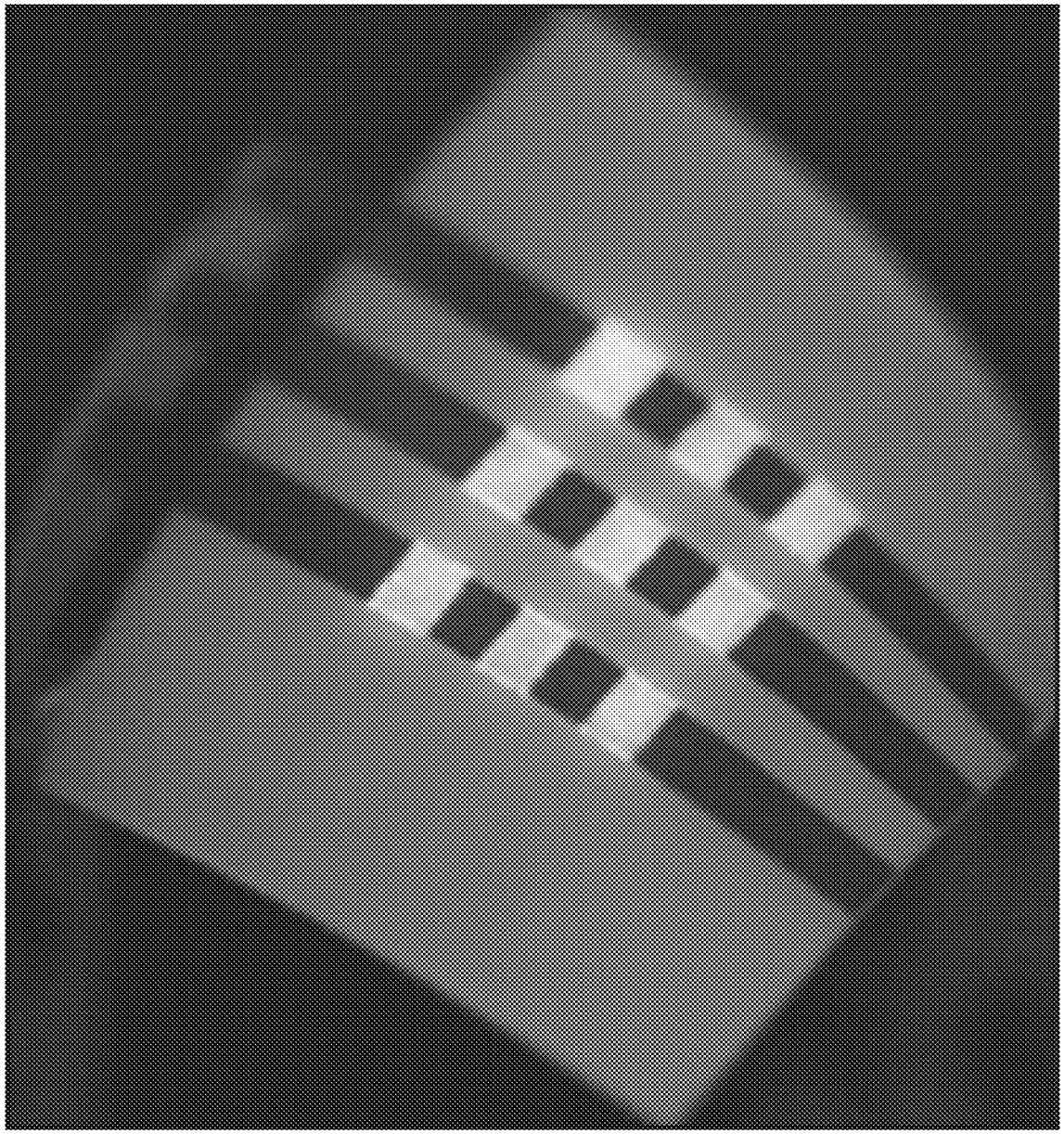
FIG. 25 is a photograph of a ZnO nanowire embedded AC electroluminescent device on a flexible PET substrate, in a prototype of this invention.

FIG. 25 is a photograph of a ZnO nanowire embedded AC electroluminescent device on a flexible PET substrate, in a prototype of this invention. In this device, light comes through the thin Au instead of ITO. However, it still shows the same distinctive EL color from phosphor layer.

Since nanowires can withstand more strain than thin film by having inter-wire spaces without cracking, a nanowire embedded ACEL device can be useful for, among other things, flexible lighting or display devices with high efficiency, low voltage operation. Flexible nanowire embedded ACELs are also well-suited for use in a large scale flexible device.

Figure 26A:
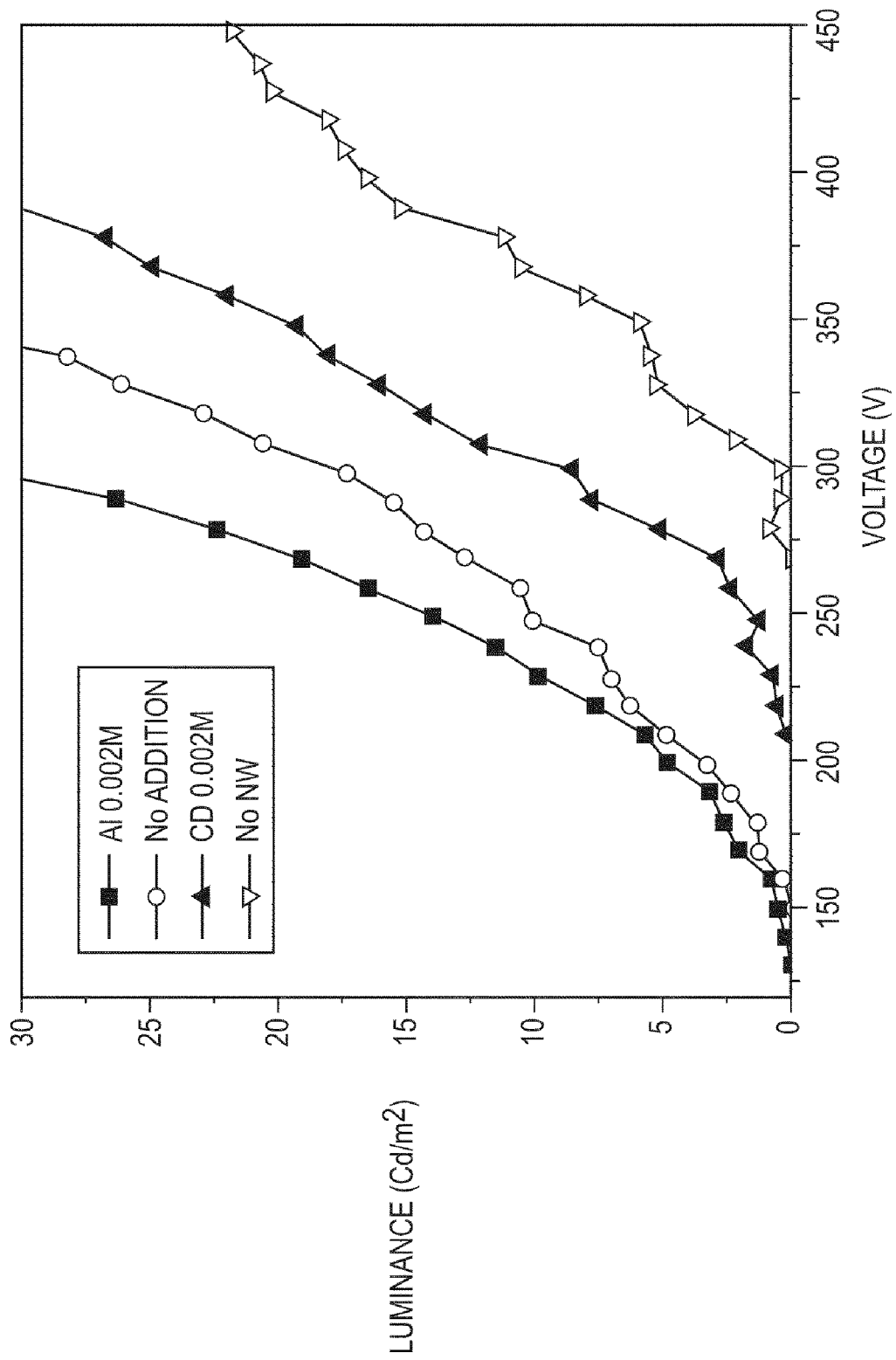
FIG. 26A is a graph of voltage dependent luminance data with different nanowires embedded under ZnS:Mn layers, in a prototype of this invention.

FIG. 26A is a graph of voltage dependent luminance data with different nanowires embedded under ZnS:Mn layers, in a prototype nanowire embedded ACEL: (1) Al 0.002M: additional Al2(504)3 0.002M added during growth; (2) No addition: ZnO nanowires grown only with ZnSO4, NH4Cl in DI water solution with NaOH pH 11; (3) Cd 0.002M: additional CdSO4 0.002M added during growth, and (4) No NW: only 30 nm ZnO seed layer exists without nanowire growth. FIG. 26B comprises photographs of electroluminescent light emission from each device operating at 260 V. From left to right: No NW, Cd 0.002M, No addition, Al 0.002M.

Voltage dependent characteristics of each device are shown in FIG. 26A. Within hydrothermally grown ZnO embedded ACEL devices (Al 0.002M, no addition, Cd 0.002M), the trend was similar to the field emission device described above. The device with high aspect ratio nanowire (Al 0.002M) had a low threshold voltage to reach same luminance compared to the device with lower aspect ratio nanowire (no additional cation), followed by lowest aspect ratio plate (Cd 0.002M) device. For the higher aspect ratio structures, a locally enhanced electric field near the tip may be a key factor in the enhanced luminance. In this prototype, introduced nanowires or nanoplates with sharp tips enhance light emission in the ACEL device.

Depending on the ZnO nanostructures embedded in the ACEL device, the maximum efficiency changed drastically. High aspect ratio devices (Al 0.002M) showed greater than a 10-fold increase in maximum efficiency (0.065 μm/W) compared to ACEL devices without nanowires (0.006 lm/W). Optimization of nanowire shape, spacing between nanowires, length of nanowires, thickness of phosphor layer and dielectric layer may be used for further efficiency improvement.

Thus, in a prototype of this invention, a high efficiency, low voltage ACEL device is created by introducing optimized nanowire structures between phosphor and electrode layer. Controlling the morphology of nanostructure synthesis in a hydrothermal process (in order to achieve higher aspect ratios) gives an efficiency increase. Depending on the morphology and aspect ratio of nanostructures, luminance and luminance efficiency at a given voltage changes dramatically.

NW-ACELs fabricated according to principles of this invention have a wide range of uses. For example, they may be used as lighting devices for rugged display, consumer electronics, and LCD or OLED displays having a brightness range of 350~1000 $Cd/m^2$.

Another application of this invention is for in-situ fabrication of light emitting dioides (LEDs).

As noted above, using microfluidic channels with hydrothermal nanowire synthesis allows self-aligned in-situ synthesis and integration into a functional device. This eliminates the need for transfer printing or etching steps typically involved in flexible electronics.

In a prototype of this invention, an all-inorganic in-situ fabricated multi-layer light-emitting diode (LED) is produced, by sequentially flowing in solution-processable reagents. In this approach, the microfluidic manifold acts not only as a micro-reactor that improves the control over synthesis parameters and diminishes reagent consumption, but also as the bottom-up fabrication house of a multi-layer optoelectronic device, and finally is included in the packaged end-device itself.

Figure 27:
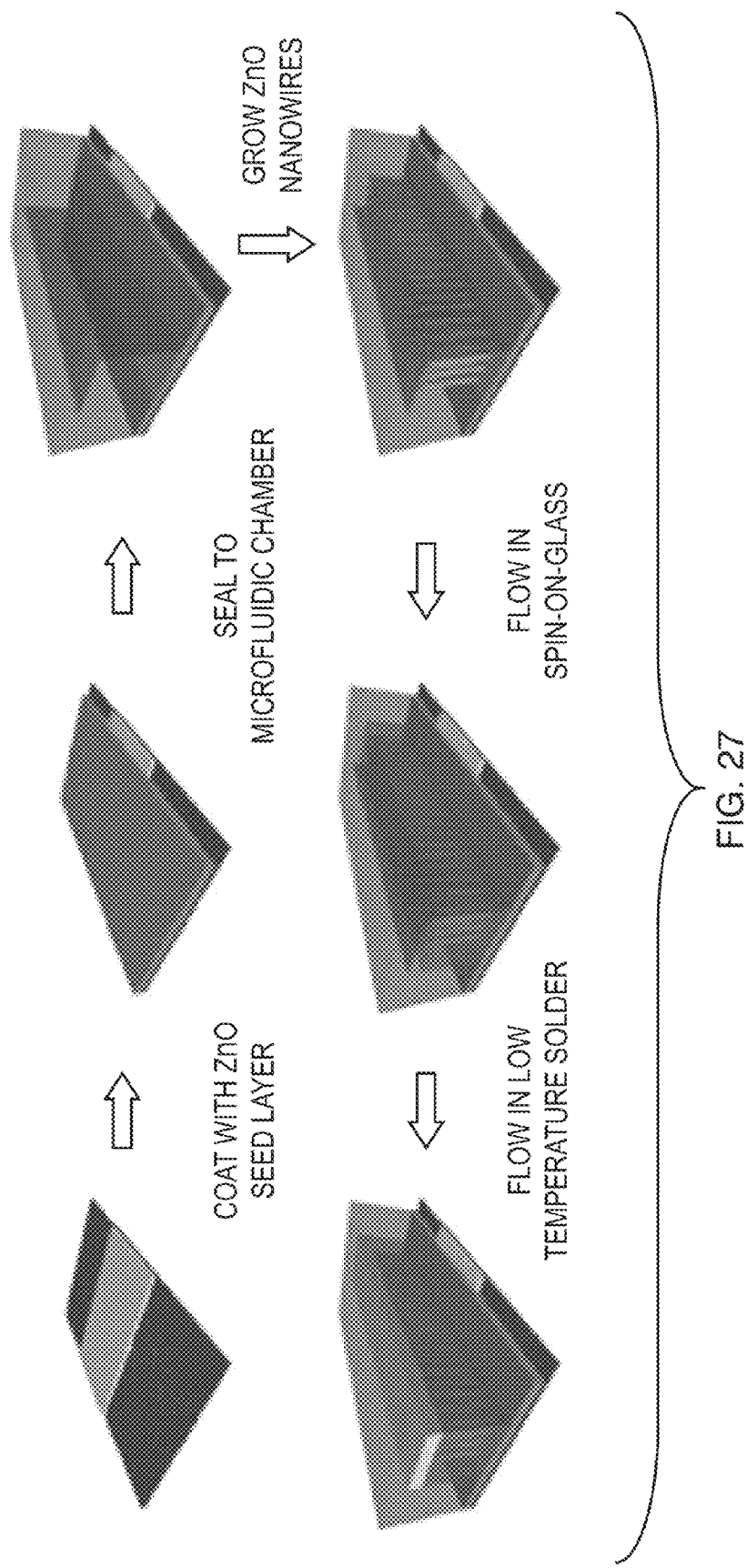
FIG. 27 is a flow chart of steps comprising in situ fabrication of an LED, in a prototype of this invention.

In this prototype, a metal-insulator-semiconductor light emitting diode (MIS LED) was in-situ fabricated by sequentially synthesizing nanowires in a microfluidic manifold on top of indium tin oxide-coated glass or PET, and then by subsequently flowing in a spin-on-glass, acting as an insulator layer, through the channel to a film thickness of 240 nm, followed by a low melting solder that fills the remainder of the channel. FIG. 27 is a flow chart of steps comprising that process for fabricating an MIS-LED. The fully fabricated and packaged device is optically transparent.

In some implementations, an MIS-LED was fabricated as follows: A 100 um (width)×80 um (height)×15 mm (length) microfluidic channel was made using SU-8 mold as described above. To bond the PDMS and a ZnO coated ITO patterned glass, a precut PDMS layer was put on top of uncured PDMS pre-polymer (GE, RTV 615) at a component A to B ratio of 10:1 spin coated on top of Si wafer at 6000 rpm for 4 minutes. The PDMS was then transferred to ZnO coated substrate, followed by curing in a convection oven at 80 C for 3 hours. Nanowire growth in microfluidic channel was performed with same solution as bulk condition described above at 50 C for 30 minutes at a flow rate of 0.6 mL/h SOG flowed through the channel at flow rate of 1 mL/h for 10 seconds at 200 C with a same flow direction as growth. The top electrode was formed by flowing molten metal (In52/Sn48, AIM Specialty Inc.) with a low vacuum from the opposite end of the channel at 200 C.

This approach allows in-situ device fabrication of MIS LED with microfluidic ZnO nanowire synthesis.

In a prototype of this invention, all active device components (active ZnO nanowire, SOG, and electrodes) of the MIS-LED were fabricated within a microfluidic channel.

Figure 28A:
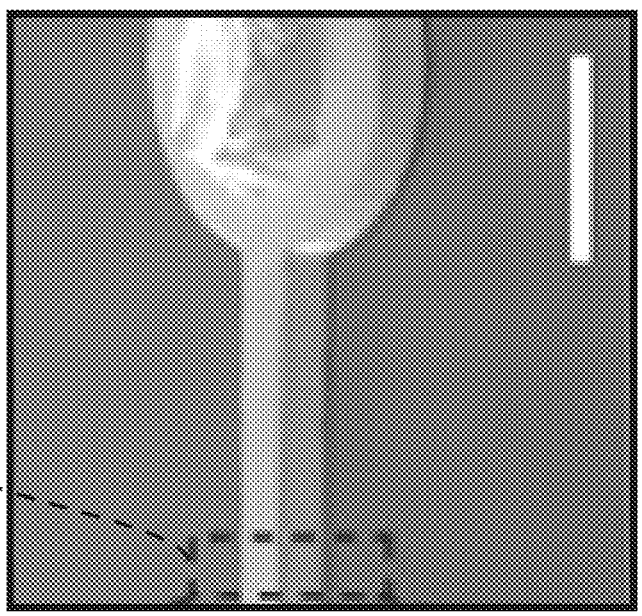
FIG. 28A is a cross sectional SEM image of SOG/ZnO in a microfluidic channel, in a prototype of this invention.
Figure 28B:
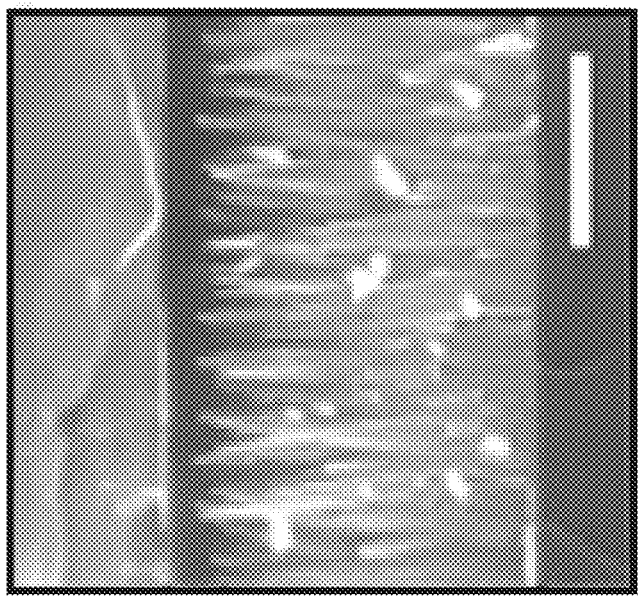
FIG. 28B is a 45 degree tilted SEM image of metal/SOG/ZnO, in that prototype.

FIG. 28A is a cross sectional SEM image of SOG/ZnO in a microfluidic channel, in this prototype. FIG. 28B is a 45 degree tilted SEM image of metal/SOG/ZnO, in this prototype. The top PDMS layer was detached for the imaging.

In the example shown in FIGS. 28A and 28B, SOG thickness was ~240 nm. Molten metal conformally coated on top of SOG layer up to the PDMS structure (FIG. 28B), and formed as a top electrode.

Microfluidic in-situ device fabrication has several advantages. Since each channel can be filled with different chemical solutions, a multi color component LED can be made within one chip by growing different bandgap materials at each channel. Also, the fluidic process consumes minimal chemical solution.

In this prototype, spin on glass effectively fills the gap of active emission layer of ZnO and performs as an insulator for accumulating electron charges at the interface. Threshold voltages increase as SOG layer thickness increases. Variable annealing temperatures may be used to increase band edge ultraviolet emission.

Advantageously, most of the steps of this LED fabrication are low temperature based solution processes, including insulator layer deposition. Thus, this fabrication process is well suited to make a flexible MIS ZnO nanowire LED, for use as a flexible ZnO UV or white light source.

Another application of this invention is make a full oxide nanowire photovoltaic device.

A nanowire-based photovoltaic cell is desirable because it can separate light absorption length and exciton diffusion length. Desirably, a nanowire based photovoltaic cell has a thick absorbing layer for full spectral absorption, and small nanowire spacing for short exciton diffusion. To create optimized geometry, spatial control in the synthesis of semiconductor nanowires is important. However, conventional position control of Vapor-Liquid-Solid or hydrothermal nanowire growth is expensive and time consuming because electron beam lithography, which is a serial process, is required to form specific nucleation sites.

In a prototype of this invention, ZnO nanowires for full oxide photovoltaic cells are spatially controlled using self-assembled polystyrene-b-polymethylmethacrylate (PS-b-PMMA) diblock copolymer templates. Tunable spacing is controlled by the size of polymers. This scheme can be used for nanowire synthesis with high precision tunable spacing in a massively parallel manner because the nucleation site is controlled by self assembly process. Compared to conventional processes, the self assembled PS template also gives an additional advantage, providing insulation from the bottom ZnO seed layer for device integration. In this prototype, for a p-type material, cupric oxide ($Cu_2O$) is used because it is an earth abundant material that has shown a strong potential in thin film photovoltaic applications due to its direct bandgap energy (1.9~2.1 eV). The theoretical conversion efficiency of a Cu2O solar cell is in the order of 20%, comparable to Si. By using these two materials with defined nanostructures, a low cost, yet efficient photovoltaic system is achieved.

Figure 29:
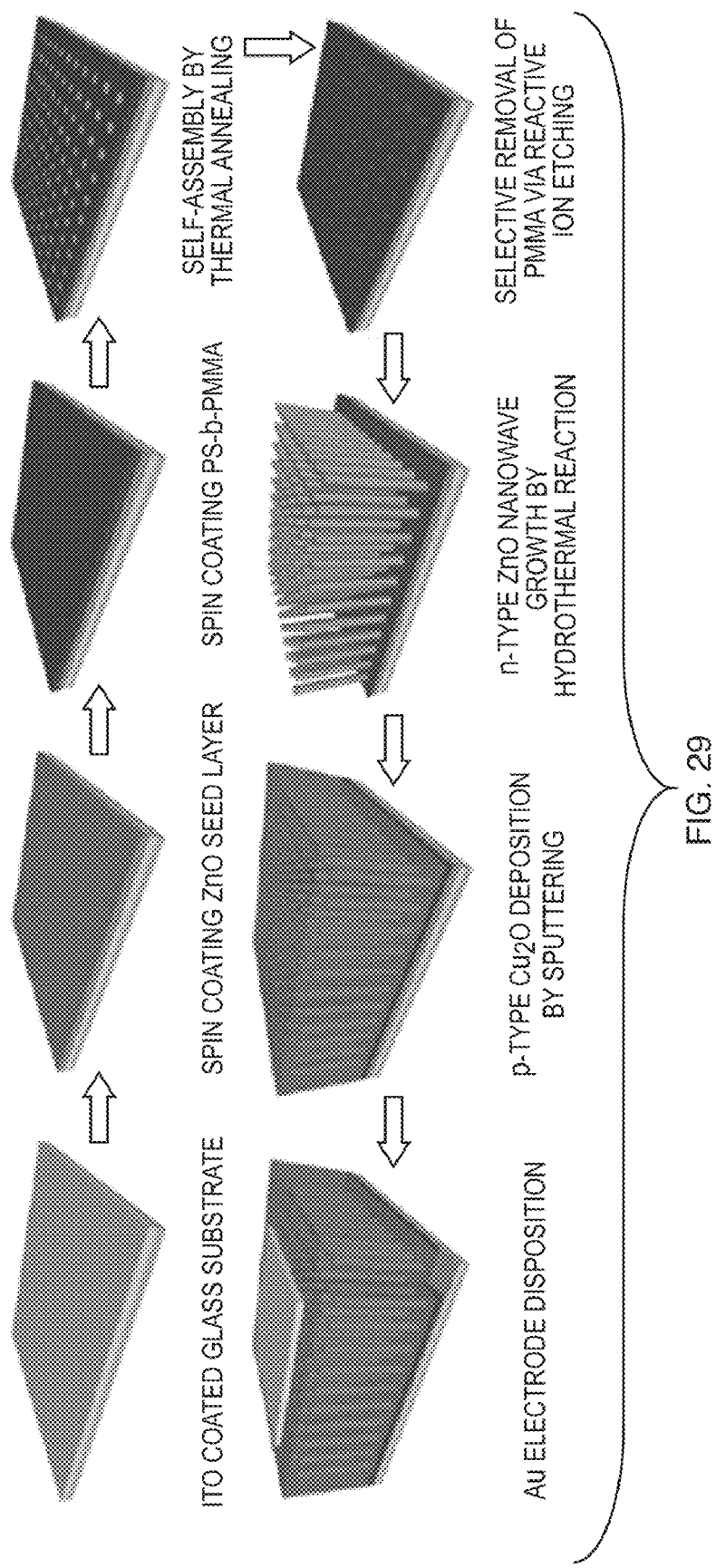
FIG. 29 is a flow chart of steps comprising the fabrication of a nanowire embedded full oxide solar cell, in a prototype of this invention.

FIG. 29 is a flow chart of steps comprising the fabrication of a nanowire embedded full oxide solar cell, in a prototype of this invention. A PS-b-PMMA block copolymer is spin coated on top of ZnO seed layer coated ITO substrate, and thermally annealed. Oxygen plasma removes PMMA, forming PS templates. The substrate is transferred to a supersaturated solution bath and grows ZnO nanowires only at seed layer exposed positions at temperature 60 C~80 C. $Cu_2O$ layer is deposited by DC reactive sputtering on top of ZnO nanowire, providing high interface area of p-n heterojunction. Finally, metal electrode is deposited using a shadow mask for the solar cell device.

In more detail: up to ZnO nanowire synthesis in PS templates, the procedure for this solar cell fabrication is the same as described above for block copolymer template ZnO nanowire assembly (described below). After the nanowires are synthesized, $Cu_2O$ is conformally deposited by reactive DC magnetron sputtering with copper target in the presence of argon and oxygen. Finally, 100 nm thick Au ($Cu_2O$ side) and Au (ITO side) electrodes are deposited by e-beam evaporation with a shadow mask.

Under the $Cu_2O$ layer, ZnO nanowire structure was used to overcome the short minority carrier diffusion length of $Cu_2O$ by minimizing the photo generated carrier travel distance. To achieve this goal, conformal filling of $Cu_2O$ in ZnO nanowire trenches is desirable. Slow deposition rate, and additional RF bias on the substrate was carried out to match this filling criteria. Using this approach, $Cu_2O$ is penetrated under the tip of ZnO nanowires.

In this prototype, full oxide based nanowire solar cell was achieved using ZnO nanowires. PS templates effectively prevented the device from shunting.

By increasing the nanowire spacing with longer chain block copolymer, property control by annealing and effective doping, photovoltaic cell efficiency may be increased higher than the 0.056% observed for this prototype. Also, nanowire based structure may be optimized to allow light to be absorbed in the vertical direction while allowing exciton diffusion in lateral direction more effectively.

Advantageously, $Cu_2O$ and ZnO are stable and abundant materials, making them well-suited for use in low cost, long lifetime photovoltaic cells.

In some implementations of this invention, spatial and positional control of nanowires is achieved by using diblock copolymer templates. This may be used in combination with the control of aspect ratio. For example, the aspect ratio, position and spacing of fabricated nanowires may be tuned to desired values that are uniform across the entire fabricated device or that vary locally within the fabricated device.

Spatial and positional control in the synthesis of semiconductor nanowires is of great interest because a device performance is highly influenced by position and spacing of nanomaterials. Among several semiconductor nanostructures, zinc oxide (ZnO) nanowire with direct band gap is one of the most important functional materials used for room temperature UV lasers, piezoelectric energy generators, photo detectors, gas sensors, and solar cells. A conventional position control of hydrothermal nanowire growth is expensive and time consuming because electron beam lithography, which is a serial process, is required to form specific nucleation sites.

In a prototype of this invention, spatially controlled hydrothermal ZnO nanowire synthesis is performed using self-assembled polystyrene-b-polymethylmethacrylate (PS-b-PMMA) diblock copolymer templates. The spacing is controlled by the length of block polymer chains. This scheme can be used for the nanowire synthesis with high precision tunable spacing in a massively parallel manner because the nucleation site is controlled by self assembly process.

In this prototype, spatial and positional control of nanowire synthesis is achieved using diblock copolymer templates, as follows: First, a thin ZnO seed layer is coated on a pre-cleaned substrate either by spin coating or RF sputtering followed by plasma treatment at 100 W with 10 sccm oxygen for 30 seconds. 1 wt % random brush copolymer (PS-r-PMMA-OH, Polymer Source) in anhydrous toluene is spin coated at 5000 rpm for 40 sec, then thermally annealed at 170 C for 2 days at $N_2$ environment. The substrate is then taken out and sonicated in anhydrous toluene for 5 minutes, forming a monolayer of random PS-r-PMMA polymer. On this substrate, 1~1.5 wt % PS-r-PMMA diblock copolymer (150 k-b-57 k, Polymer Source) in anhydrous toluene is spin coated at 4000~6000 rpm for 50 seconds to deposit 50~60 nm, followed by thermally anneal at 190 C for 2 days at $N_2$ environment. At this step, the block copolymer forms an ordered array of PMMA dots in PS matrix. After the sample is cooled down to room temperature, oxygen plasma at 100 W with 10 sccm is treated to etch PS and PMMA at different rates until PMMA dots are fully removed and only leaving PS matrix templates. This substrate is then introduced into supersaturated solutions with various ion concentrations ($ZnSO_4$, $NH_4Cl$, and NaOH), generating nanowires by hydrothermal reaction at temperatures from 60 C to 80 C only at ZnO seed layer exposed positions.

Figure 30:
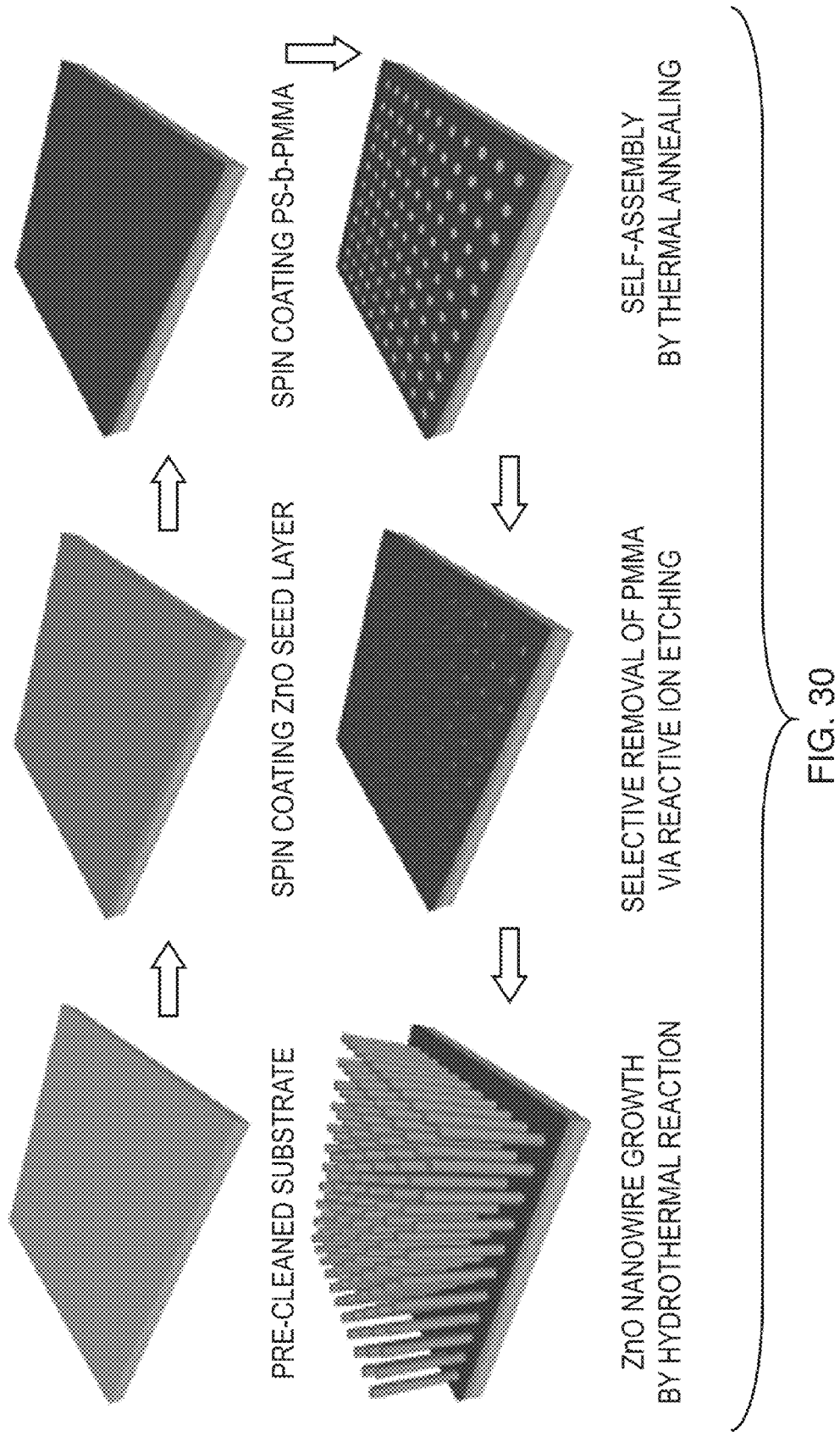
FIG. 30 is a high level flow chart of a procedure for spatially controlled ZnO nanowire synthesis using diblock copolymer templates, in a prototype of this invention.

FIG. 30 is a high level flow chart of a procedure for spatially controlled ZnO nanowire synthesis using diblock copolymer templates, in this prototype. A PS-b-PMMA block copolymer thin film is spin coated on seed layer coated substrate and thermally annealed. The self assembled block copolymer patterns are oxygen plasma treated to remove PMMA and form PS templates. The substrate is transferred to a supersaturated solution bath, and ZnO nanowires are synthesized only at seed layer exposed locations by hydrothermal reaction at temperature 60 C~80 C.

Controlling the thickness is desirable for block copolymers assembling into desired shape. In this prototype, a matrix with circular dots is used to expose the bottom ZnO seed layer for further nanowire growth with distant spacing. Generally, perpendicular alignment of lamellae or cylinders is created when the substrate has a surface energy neutral with respect to each component by random copolymer brush formation. Depending on the thickness, PS-PMMA can either form cylinders lying parallel or vertical orientations. To find the right condition, PS-b-PMMA samples with different thickness were tested. When the initial thickness of spin coated layer was 40 nm or below, self assembly was driven to form linear or wiggled PS arrays parallel to the substrate. When the thickness was above 40 nm, block copolymer was vertically aligned and formed vertically aligned cylindrical arrays with minor misaligned shapes. In light of these test results, it was decided to use an initial thickness of 50~60 nm.

In this example, the bottom of nanowires have an initial small size of growth matching PS matrix confinement, but thicker growth above a certain height. Nanowires can grow laterally once the growth reaches above the PS confined structure. To compensate for this, a thicker matrix and wider dimension of self assembly may be used, or PS-b-PMMA with larger molecular weight may be used.

In this example, hydrothermal nanowire growth is guided by self assembled block copolymer templates. Using PS-b-PMMA block copolymer, PS matrix with 40~50 nm holes is made by oxygen plasma etch. Nanowire growth solution is compatible with block copolymer layer without dissolving PS matrix within the growth period. ZnO nanowires are grown from the exposed region of the block copolymer template. Growth direction of nanowires is not perfectly vertical, because the seed layer was amorphous ZnO layer. To synthesize nanowires with nearly perfect spacing, c-axis oriented ZnO or other single crystal layer that matches with (0001) ZnO plane crystalline lattice may be used.

This spatial and positional control method (using diblock copolymer templates) is desirable because it allows low temperature solution process, parallel pattern formation, and parallel growth. In these parallel formations, aspect ratio and other features of the nanowires may be locally varied (e.g., between different microfluidic channels or within a single microfluidic channels.) This spatial control method has a wide range of applications. For example, it may be employed in a high sensitivity photo detector sensor, flexible ultraviolet light emitting diode, or high efficiency photovoltaic cells.

Depending on the particular implementation of this invention, the ability to control nanowire morphology in hydrothermal synthesis may comprise any one or more of the following (in any combination): the ability (1) to tune aspect ratio, (2) to control spacing and position, (3) to vary geometry (such as aspect ratio, position or spacing) in different microfluidic channels, (4) to vary geometry within a single microfluidic channel, and (5) the ability to vary nanowire morphology between different layers of a single fabricated device, or even within a single layer.

This invention may be implemented in many ways, in addition to those described above. Here are a few examples:

Other nanowire materials may be used instead of zinc oxide. For example, other oxides such as TiO2, CuO, MgO may be employed. Or, for example zinc nitrate may be used with ancillary ions with nitrate (instead of sulfate).

Other ancillary ions may be used. For example, ancillary ions that form hydroxyl and amine complexes may be employed.

In an alternate implementation of this invention, hierarchical nanowire synthesis is performed as follows: on a silicon nanowire or ZnO nanowire backbone, coat the seed layer by solution and grow lateral nanowires, forming multiple branched nanowire tree shape to increase surface/volume ratio.

In alternate implementations of this invention, other methods of positional control may be used (instead of using block copolymer copolymer self assembly as a template for positioning specific seed layer locations) For example, for a massively parallel nanoimprint process, local catalyst deposition by electrostatic system, or polymer dewetting may used to create a regular array with defined spacing.

Alternately, this invention may be used for fabrication of other optoelectronic, piezoelectronic, solar energy harvesting, and energy storage devices (e.g. Zn-air or Zn-silver batteries).

In some implementations, this invention may be used for fabricating sensing devices that employ piezoelectronic materials. For example, ZnO is a piezoelectronic and may be used as an artificial cilia.

As used herein, the "aspect ratio" of a nanowire means a fraction, the numerator of which is the height of the nanowire and the denominator of which is the diameter of the nanowire.

CONCLUSION

It is to be understood that the methods and apparatus which have been described above are merely illustrative applications of the principles of the invention. Numerous modifications may be made by those skilled in the art without departing from the scope of the invention. The scope of the invention is not to be limited except by the claims that follow.

What is claimed is:

1. An improved method of growing zinc oxide nanowires, the improvement comprising growing zinc oxide nanowires by inorganic hydrothermal synthesis and adding non-zinc metal cations to an aqueous solution used for the synthesis, to cause the aspect ratio of the nanowires produced by the synthesis to be greater than it would be if the cations were not added.

2. The method of claim 1, wherein the cations comprise aluminum, indium or gallium cations.

3. The method of claim 1, wherein the synthesis occurs in at least one microfluidic channel.

4. The method of claim 3, wherein multiple microfluidic channels are employed for the synthesis, and wherein the identity or concentration of the non-zinc metal cations differs between at least some of the microfluidic channels.

5. The method of claim 3, wherein the height of nanowires grown in a microfluidic channel varies depending the position of the nanowires in the channel.

6. The method of claim 1, wherein the synthesis occurs at temperatures at or below 60 degrees Celsius.

7. The method of claim 1, wherein the improvement is part of a process for controlling the aspect ratio of zinc oxide nanowires grown in hydrothermal synthesis, wherein the control includes both the ability to increase and the ability to decrease the aspect ratio, wherein aspect ratio is increased by adding non-zinc metal cations that form complex ions that inhibit radial growth by electrostatic crystal growth inhibition, and wherein aspect ratio is decreased by adding non-zinc metal cations that form complex ions that inhibit axial growth by electrostatic crystal growth inhibition.

8. The method of claim 7, wherein cadmium, copper, magnesium or calcium cations are added to inhibit axial growth.

9. A method for making zinc oxide nanostructures, wherein the nanostructures are produced by hydrothermal synthesis in microfluidic channels, and wherein non-zinc metal cations form complex ions, which complex ions are electrostatically attracted to some but not all of the crystalline faces of the nanostructure, and which complex ions inhibit the growth of the crystalline faces to which they are attracted.

10. The method of claim 9, wherein the metal cations comprise aluminum, indium or gallium cations.

11. The method of claim 9, wherein radial growth of the nanostructures is inhibited.

12. The method of claim 9, wherein the synthesis is entirely inorganic.

13. The method of claim 9, wherein the synthesis occurs at temperatures at or below 60 degrees Celsius.

14. The method of claim 9, wherein the growth rate of zinc oxide nanostructures within a microfluidic channel depends at least in part on the distance of the nanostructures from the inlet of the channel.

15. The method of claim 9, further comprising varying the morphology of zinc oxide nanostructures in different layers of a fabricated device.

16. The method of claim 9, further comprising varying the morphology of zinc oxide nanostructures within a single layer of a fabricated device.

17. The method of claim 9, further comprising the step of embedding at least some of the synthesized nanostructures in an alternating current electroluminescent device.

18. The method of claim 9, further comprising the in situ microfluidic fabrication of a multi-layer light emitting diode, which diode includes at least some of the synthesized nanostructures.

19. A process of making a nanostructure by inorganic aqueous crystal growth, wherein metal cations form complex ions that are electrostatically attracted to, and that inhibit the growth of, at least one but not all of the crystalline faces of the nanostructure.

20. The process of claim 19, further comprising the step of modeling face-selective electrostatic growth inhibition, which modeling includes calculating speciation plots of complex ion distributions based on thermodynamic constants and pH-dependent surface charges.

* * * * *